US011417408B2

(12) United States Patent
Son

(10) Patent No.: US 11,417,408 B2
(45) Date of Patent: Aug. 16, 2022

(54) SEMICONDUCTOR DEVICE INCLUDING DEFECT DETECTION CIRCUIT AND METHOD OF DETECTING DEFECTS IN THE SAME

(71) Applicant: Samsung Electronics Co., Ltd., Suwon-si (KR)

(72) Inventor: Jongpil Son, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/199,955

(22) Filed: Mar. 12, 2021

(65) Prior Publication Data

US 2022/0036958 A1 Feb. 3, 2022

(30) Foreign Application Priority Data

Jul. 29, 2020 (KR) .......................... 10-2020-0094375

(51) Int. Cl.
*G11C 29/00* (2006.01)
*G11C 29/12* (2006.01)
(Continued)

(52) U.S. Cl.
CPC .......... *G11C 29/1201* (2013.01); *G11C 29/10* (2013.01); *G11C 29/12015* (2013.01); *G11C 29/36* (2013.01); *G11C 2029/3602* (2013.01)

(58) Field of Classification Search
CPC ................ G11C 29/1201; G11C 29/10; G11C 29/12015; G11C 29/36; G11C 2029/3602
See application file for complete search history.

(56) References Cited

U.S. PATENT DOCUMENTS 6,449,748 B1   9/2002 Jeng et al.
7,649,200 B1   1/2010 Miller et al.
(Continued)

FOREIGN PATENT DOCUMENTS

CN   102753984 A   10/2012
JP   2013-0219084 A   10/2013
(Continued)

OTHER PUBLICATIONS

Extended European Search Report dated Sep. 22, 2021 issued in corresponding European Patent Application No. 21162580.1-1010.
(Continued)

*Primary Examiner* — Mohammed A Bashar
(74) *Attorney, Agent, or Firm* — Harness, Dickey & Pierce, P.L.C.

(57) ABSTRACT

A semiconductor device includes a semiconductor die having a peripheral region surrounding, a defect detection circuit in the peripheral region, the defect detection circuit arranged in an open conduction loop, the defect detection circuit comprising a plurality of latch circuits and a plurality of defect detection conduction paths, each defect detection conduction path of the plurality of defect detection conduction paths connecting two adjacent latch circuits of the plurality of latch circuits, and a test control circuitry configured to perform (a) a test write operation by transferring bits of an input data pattern in a forward direction of the open conduction loop to cause the plurality of latch circuits to store the bits of the input data pattern in the plurality of latch circuits, and (b) a test read operation by transferring bits stored in the plurality of latch circuits in a backward direction of the open conduction loop.

20 Claims, 47 Drawing Sheets

(51) Int. Cl.
  *G11C 29/10*  (2006.01)
  *G11C 29/36*  (2006.01)

(56) References Cited

U.S. PATENT DOCUMENTS

| | | |
|---|---|---|
| 8,624,242 B2 | 1/2014 | Kojima et al. |
| 10,330,726 B2 | 6/2019 | Werhane et al. |
| 10,629,546 B2 | 4/2020 | Roh |
| 2008/0172196 A1* | 7/2008 | Kang .................... G06T 7/0006 |
| | | 702/81 |
| 2009/0245000 A1* | 10/2009 | Anzou .................... G11C 29/44 |
| | | 365/201 |
| 2012/0286296 A1 | 11/2012 | So et al. |
| 2018/0075929 A1* | 3/2018 | Kim ..................... G11C 7/1012 |
| 2019/0164911 A1 | 5/2019 | Pan et al. |
| 2019/0271739 A1 | 9/2019 | Werhane et al. |
| 2019/0369163 A1 | 12/2019 | Werhane et al. |
| 2020/0091021 A1 | 3/2020 | Lee et al. |

FOREIGN PATENT DOCUMENTS

| | | |
|---|---|---|
| TW | 201935019 A | 9/2019 |
| WO | WO-2019/156734 A1 | 8/2019 |

OTHER PUBLICATIONS

Taiwanese Office Action and Search Report dated Nov. 29, 2021 issued in corresponding Taiwanese Patent Application No. 110110785.

* cited by examiner

FIG. 8B

| DPI | | | | LC12 → | | | | | | | | | | LC1 → | |
|---|---|---|---|---|---|---|---|---|---|---|---|---|---|---|---|
| CR1 | B1 | B2 | B3 | B4 | B5 | B6 | B7 | B8 | B9 | B10 | B11 | B12 |
| CR2 | B11 | B11 | B11 | B11 | B11 | B11 | B11 | B11 | B11 | B11 | B11 | B12 |
| CR3 | B8 | B8 | B8 | B8 | B8 | B8 | B8 | B8 | B11 | B10 | B11 | B12 |
| CR4 | B5 | B5 | B5 | B5 | B5 | B6 | B7 | B8 | B9 | B10 | B11 | B12 |
| | B2 | B2 | B3 | B4 | B5 | B6 | B7 | B8 | B9 | B10 | B11 | B12 |

DP0

SEMICONDUCTOR DEVICE INCLUDING DEFECT DETECTION CIRCUIT AND METHOD OF DETECTING DEFECTS IN THE SAME

CROSS-REFERENCE TO RELATED APPLICATION

This U.S. non-provisional application claims priority under 35 USC § 119 to Korean Patent Application No. 10-2020-0094375, filed on Jul. 29, 2020, in the Korean Intellectual Property Office (KIPO), the disclosure of which is incorporated by reference herein in its entirety.

BACKGROUND

Some embodiments relate generally to semiconductor integrated circuits, and more particularly to a defect detection circuit, a semiconductor device including the defect detection circuit and/or a method of detecting defects in the semiconductor device.

In general, integrated circuits are fabricated/manufactured by forming repeated patterns in a substrate/wafer of semiconductor material. The wafer may be cut and/or diced into a plurality of semiconductor dies, and the respective semiconductor die may be packaged into a semiconductor chip. Cracks may occur in the semiconductor die during the cutting and/or packaging processes. To reduce yield impact of defective products, the semiconductors are inspected to detect the cracks.

SUMMARY

Some example embodiments may provide a defect detection circuit and/or a semiconductor device including the defect detection circuit for enhancing detectability of crack penetration of various types.

Some example embodiments may provide a method of detecting defects in a semiconductor device for enhancing detectability of crack penetration of various types.

According to some example embodiments, a semiconductor device includes a semiconductor die including a central region and a peripheral region surrounding the central region, a defect detection circuit in the peripheral region, the defect detection circuit arranged in an open conduction loop, the defect detection circuit comprising a plurality of latch circuits and a plurality of defect detection conduction paths, each defect detection conduction path of the plurality of defect detection conduction paths connecting two adjacent latch circuits of the plurality of latch circuits, and a test control circuitry configured to perform (a) a test write operation by sequentially transferring bits of an input data pattern in a forward direction of the open conduction loop to cause the plurality of latch circuits to store the bits of the input data pattern in the plurality of latch circuits, and (b) a test read operation by transferring bits stored in the plurality of latch circuits in a backward direction of the open conduction loop to read out an output data pattern.

According to some example embodiments, a method of detecting defects in a semiconductor device includes forming an open conduction loop in a peripheral region of a semiconductor die, the peripheral region surrounding a central region of the semiconductor die, the forming the open conduction loop by using a defect detection circuit arranged in the peripheral region, the defect detection circuit including a plurality of latch circuits and a plurality of defect detection conduction paths, each defect detection conduction path of the plurality of defect detection conduction paths connecting two adjacent latch circuits of the plurality of latch circuits, performing a test write operation by sequentially transferring bits of an input data pattern in a forward direction of the open conduction loop and storing the bits of the input data pattern in the plurality of latch circuits, performing a test read operation by transferring bits stored in the plurality of latch circuits in a backward direction of the open conduction loop and reading out an output data pattern, and determining a defect detection conduction path including the presence of or absence of a defect among the plurality of defect detection conduction paths by comparing the input data pattern and the output data pattern.

According to some example embodiments, a defect detection circuit includes a plurality of latch circuits, and a plurality of defect detection conduction paths, each defect detection conduction path of the plurality of defect detection conduction paths connecting two adjacent latch circuits of the plurality of latch circuits. The defect detection circuit is in a peripheral region of a semiconductor die surrounding a central region of the semiconductor die and is arranged in an open conduction loop, and each latch circuit of the plurality of latch circuits is configured to transfer a bit stored in each latch circuit per shifting period to an adjacent latch circuit, the transferring in a forward direction of the open conduction loop or a backward direction of the open conduction loop.

The semiconductor device and/or the associated method according to some example embodiments may detect crack penetration of various types thoroughly or more thoroughly, using the defect detection circuit including the plurality of latch circuits and the plurality of defect detection conduction paths. The semiconductor device and the associated method according to some example embodiments may prevent or reduce the likelihood of yield impact associated with bad products, and/or may enhance the detectability of the crack.

BRIEF DESCRIPTION OF THE DRAWINGS

Some example embodiments of inventive concepts will be more clearly understood from the following detailed description taken in conjunction with the accompanying drawings.

FIGS. 8A and 8B are diagrams for describing defect detection in a semiconductor device according to some example embodiments.

DETAILED DESCRIPTION OF SOME EMBODIMENTS

Figure 1:
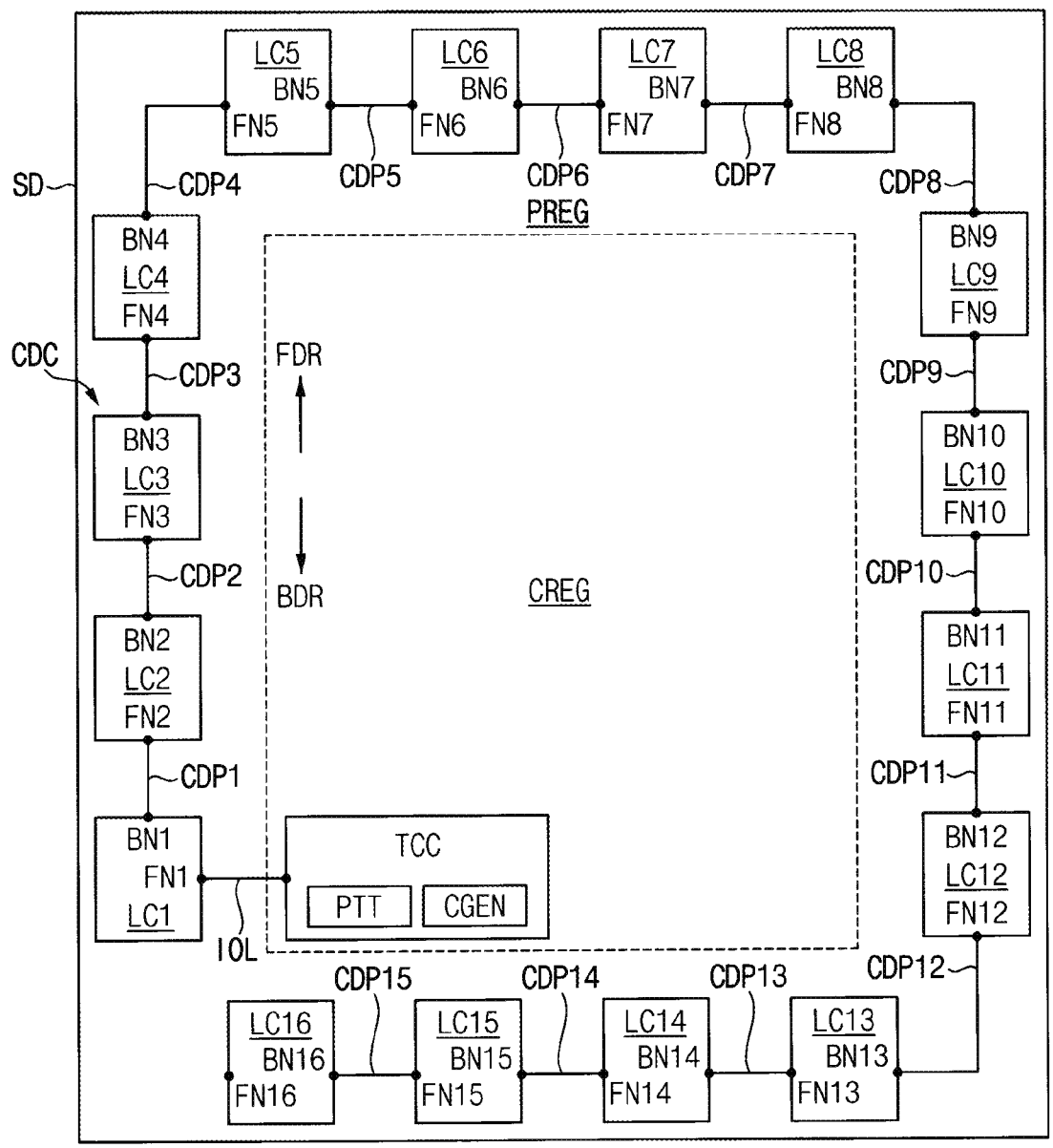
FIG. 1 is a diagram illustrating a semiconductor device including a defect detection circuit according to some example embodiments.

Various example embodiments will be described more fully hereinafter with reference to the accompanying drawings, in which some example embodiments are shown. In the drawings, like numerals refer to like elements throughout. The repeated descriptions may be omitted.

As disclosed herein, a direction substantially vertical to/perpendicular to the top surface of a substrate is referred to as a vertical direction Z, and two directions substantially parallel to the top surface of the substrate and crossing each other are referred to as a first horizontal direction X and a second horizontal direction Y. For example, the first horizontal direction X and the second horizontal direction Y may be perpendicular to each other.

Figure 2:
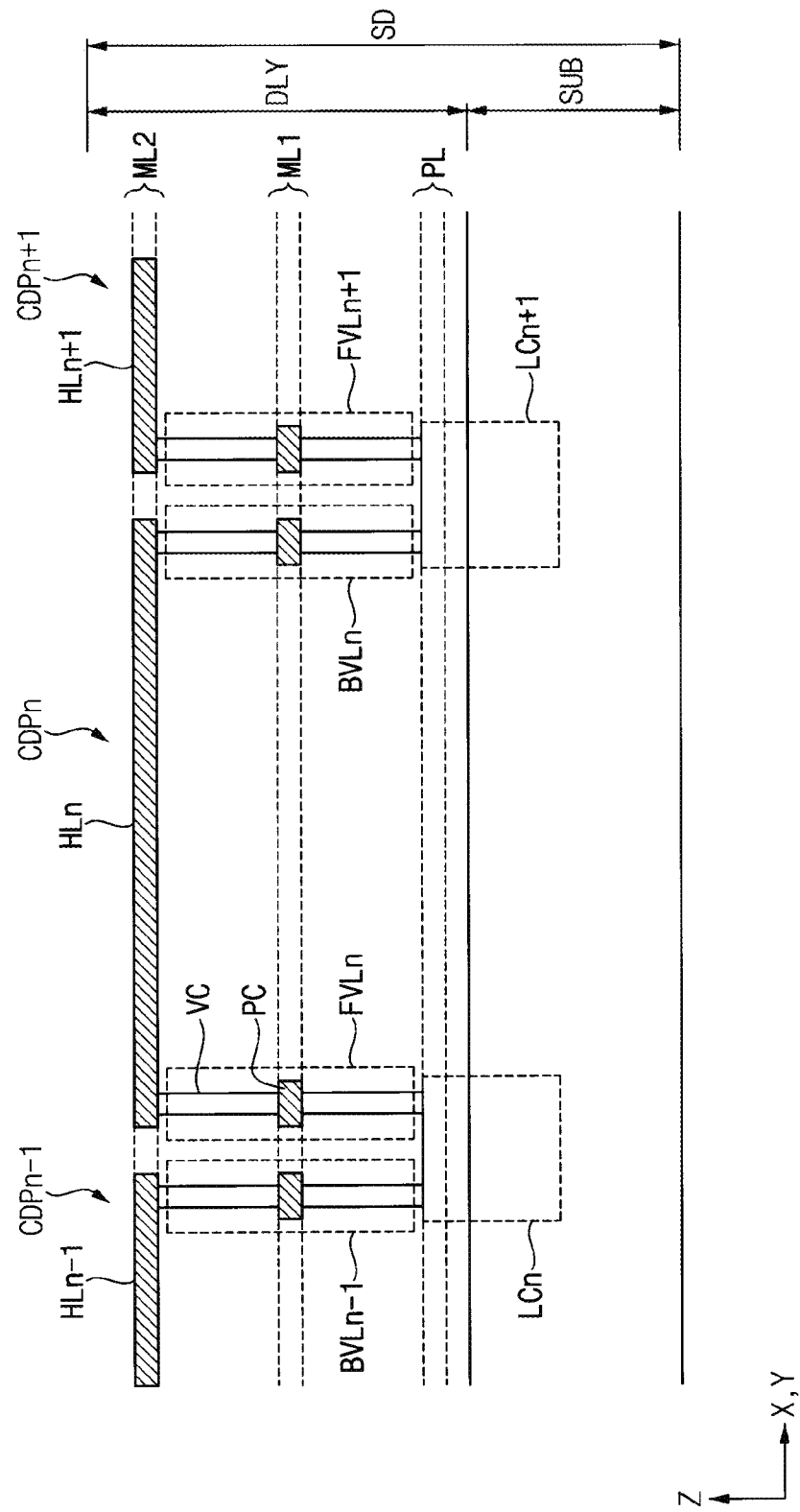
FIG. 2 is a cross-sectional diagram illustrating a vertical structure of a defect detection circuit according to some example embodiments.

FIG. 1 is a diagram illustrating a semiconductor device including a defect detection circuit according to some example embodiments, and FIG. 2 is a cross-sectional diagram illustrating a vertical structure of a defect detection circuit according to some example embodiments.

Referring to FIG. 1, a semiconductor device 100 may include at least one semiconductor die SD. The semiconductor die SD may include a central region CREG and a peripheral region PREG surrounding the central region CREG.

Various semiconductor integrated circuits may be formed in the central region CREG depending on a kind or type of the semiconductor device 100. For example, the semiconductor device 100 may be or include a semiconductor memory device and a memory integrated circuit may be formed in the central region CREG of the semiconductor die SD.

A defect detection circuit CDC may be disposed around the central region CREG within the peripheral region PREG, and may be configured to detect defects such as cracks, e.g. cracks within or partly within the semiconductor device 100. The defect detection circuit CDC may form or be arranged in an open conduction loop. The defect detection circuit CDC includes a plurality of latch circuits LC1~LC16 and a plurality of defect detection conduction paths CDP1~CDP15 such that each defect detection conduction path of the plurality of defect detection conduction paths CDP1~CDP15 connects two adjacent latch circuits of the plurality of latch circuitsLC 1~LC16. For example, the i-th defect detection conduction path CDPi (I is an integer between 1 and 15) may connect a back node BNi of the i-th latch circuit LCi with a front node FNi+1 of the (i+1)-th latch circuit LCi+1.

FIG. 1 illustrates the sixteen latch circuits LC1~LC16 and the fifteen defect detection conduction paths CDP1~CDP15 for convenience of illustration; however, example embodiments are not limited thereto, and the number of the latch circuits and/or the number of the defect detection conduction path may be determined variously.

A test control circuit TCC may be disposed in/within the central region CREG. As will be described below, the test control circuit TCC may perform a test write operation by sequentially transferring bits of an input data pattern in a forward direction FDR of the open conduction loop to store the bits of the input data pattern in the plurality of latch circuits LC1~LC16, and may perform a test read operation by transferring bits stored in the plurality of latch circuits LC1~LC16 in a backward direction BDR of the open conduction loop to read out an output data pattern. Here, the forward direction FDR indicates a direction from the first latch circuit LC1 to the last latch circuit LC16 along the open conduction loop, and the backward direction BDR indicates a direction from the last latch circuit LC16 to the first latch circuit LC1 along the open conduction loop. Furthermore although in FIG. 1 the forward direction FDR is illustrated as being clockwise around the central region CREG and the backward direction BDR is illustrated as being counterclockwise around the central region CREG, example embodiments are not limited thereto, and the forward direction FDR may be counterclockwise around the central region CREG while the backward direction BDR may be clockwise around the central region CREG. Still further, although FIG. 1 illustrates the latch circuits LC1~LC16 as looping around the central region CREG one time, example embodiments are not limited thereto, and the defect detection circuit CDC may include a plurality of latches that loop around the central region a plurality of times.

The test control circuit TCC may apply the input data pattern to the first latch circuit LC1 and may receive the output data pattern from the first latch circuit LC1, through an input-output line IOL.

In some example embodiments, the test control circuit TCC may include a pattern generator PTT such as an automatic test pattern generator (ATPG) that outputs each bit of the input data pattern per shifting period corresponding to a bit transfer period between the two adjacent latch circuits. The bits may be based on a pseudo-random number generator (PRNG); however, example embodiments are not limited thereto, and the bits may be based on an even/odd pattern, for example. In addition, the test control circuit TCC may include a clock generator CGEN that generates clock signals for controlling the test write operation and the test read operation. According to some example embodiments, the pattern generator PTT and/or the clock generator CGEN may be included in an external tester (not illustrated) and the input data pattern and/or the clock signals may be provided from the external tester to the test control circuit TCC.

The test control circuit TCC may compare the input data pattern and the output data pattern to determine a defect detection conduction path including a defect among the plurality of defect detection conduction pathsCDP 1~CDP15. According to some example embodiments, the output data pattern may be provided to the external tester and the tester may determine the defect detection conduction path including the defect.

Figure 35:
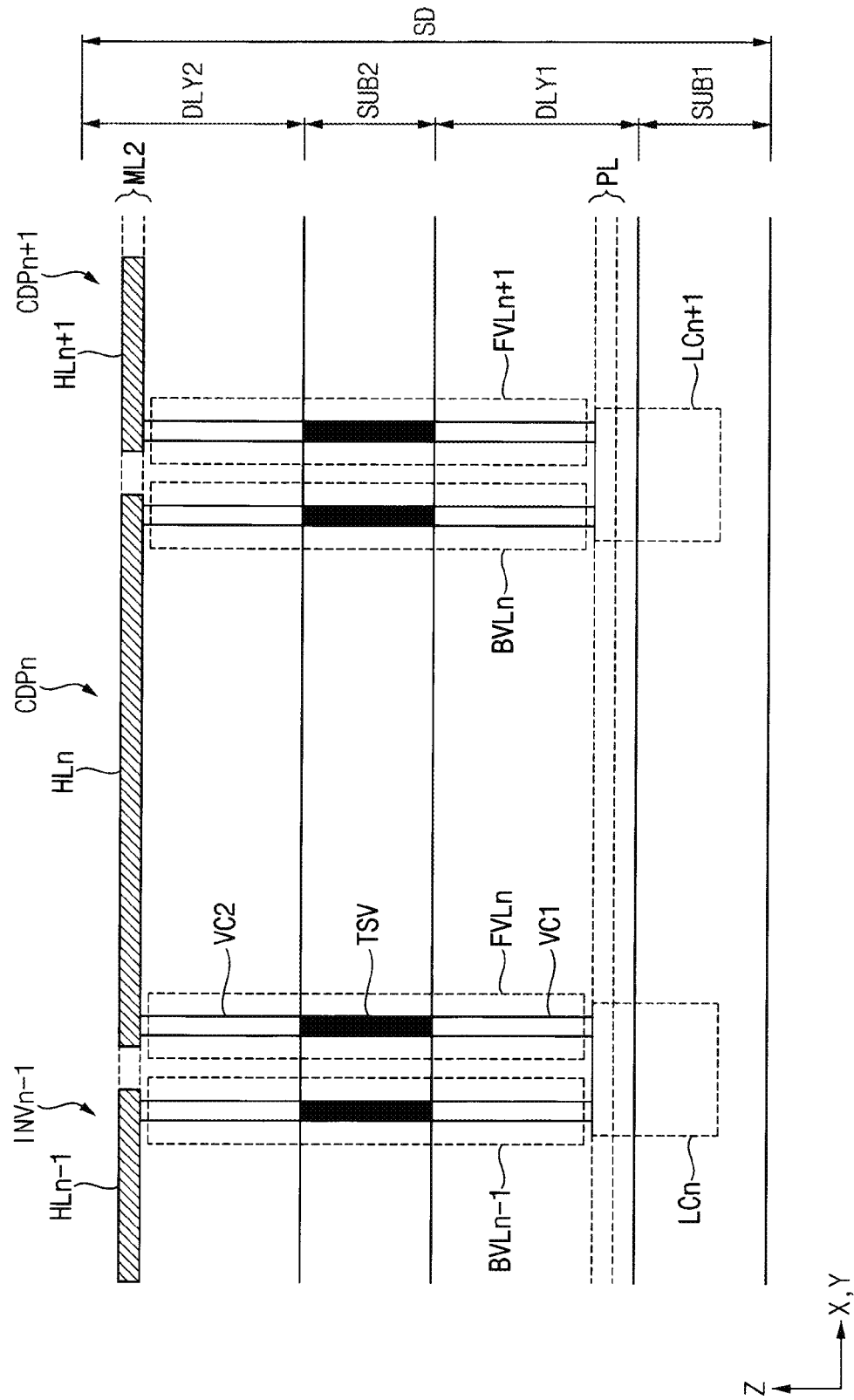
FIG. 35 is a cross-sectional diagram illustrating a stacked semiconductor device according to some example embodiments.

In some example embodiments, as illustrated in FIG. 2, the semiconductor device 100 may include at least one semiconductor die. In some example embodiments, as illustrated in FIG. 35 to be discussed below in more detail, the semiconductor device 100 may include a plurality of semiconductor dies that are stacked in the vertical direction Z.

FIG. 2 illustrates a portion of the defect detection conduction path CDP corresponding to the two adjacent latch circuits LCn~LCn+1.

Referring to FIGS. 1 and 2, each defect detection conduction path may include a horizontal line disposed in a conduction layer of/within/on the semiconductor die SD, a front vertical line connecting the horizontal line to a front latch circuit of the two adjacent latch circuits, and a back vertical line connecting the horizontal line to a back latch circuit of the two adjacent latch circuits.

For example, as illustrated in FIG. 2, the n-th defect detection conduction path CDPn may include a horizontal line HLn disposed in a conduction layer ML2 of the semiconductor die SD, a front vertical line FVLn connecting the horizontal line HLn to the front latch circuit LCn of the two adjacent latch circuits LCn and LCn+1, and a back vertical line BVLn connecting the horizontal line HLn to the back latch circuit LCn+1 of the two adjacent latch circuits LCn and LCn+1.

The defect detection conduction path CDPn may be formed in the conduction layer ML2 of the semiconductor die SD. FIG. 2 illustrates, as some examples of conduction layers, one polysilicon layer PL and two metal layers ML1 and ML2 included in a dielectric layer DLY above a semiconductor substrate SUB of the semiconductor die SD; however, example embodiments are not limited to those illustrated in FIG. 2. For example, according to some example embodiments, the semiconductor die SD may include two or more polysilicon layers and/or three or more metal layers. The conduction layer ML2 in which the horizontal line HLn is formed may be/correspond to the uppermost metal layer of the semiconductor die SD, but example embodiments are not limited thereto.

The front vertical line FVLn and the back vertical line BVLn may include conduction line patterns PC in the intervening conduction layer and vertical vias, landing pads, and/or vertical contacts VC connecting the horizontal line HLn to the latch circuit LCn.

Each latch circuit LCn may include a plurality of transistors, such as PMOS and/or NMOS transistors, such that gates of the transistors are formed in/correspond to/include at least portions of the polysilicon layer PL, and sources and drains of the transistors are formed in/correspond to/include at least portions of the upper portion of the semiconductor substrate SUB. The front vertical line FVLn and the back vertical line BVLn may extend in the vertical direction Z to the upper surface of the semiconductor substrate SUB.

Figure 3:
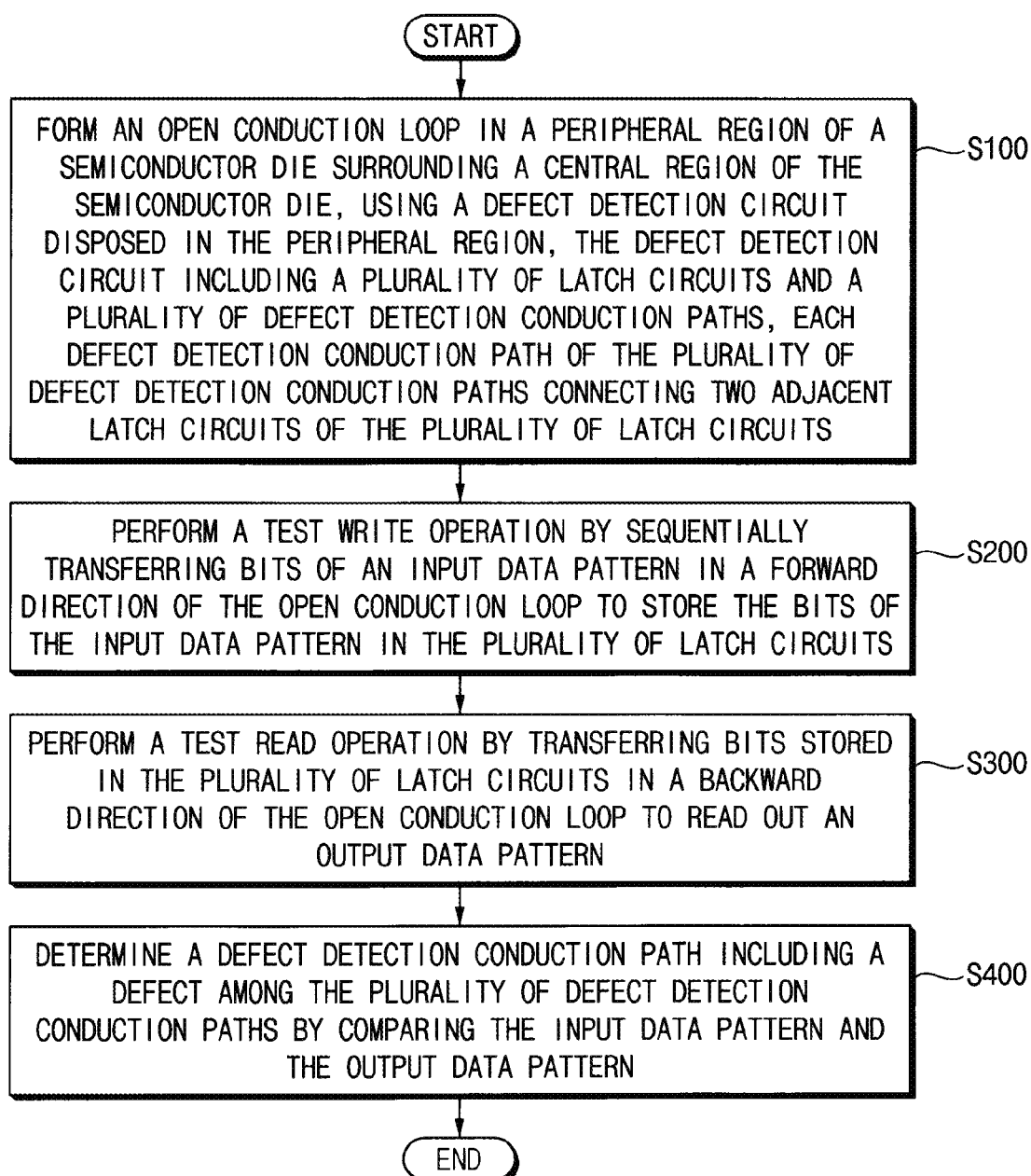
FIG. 3 is a flow chart illustrating a method of detecting defects in a semiconductor device according to some example embodiments.

FIG. 3 is a flow chart illustrating a method of detecting defects in a semiconductor device according to some example embodiments.

Referring to FIGS. 1 through 3, the open conduction loop may be formed in the peripheral region PREG of the semiconductor die SD surrounding the central region CREG of the semiconductor die SD, using the defect detection circuit CDC disposed in/within the peripheral region PREG (S100). The defect detection circuit CDC includes the plurality of latch circuits LC1~LC16 and the plurality of defect detection conduction paths CDP1~CDP15. Each defect detection conduction path of the plurality of defect detection conduction paths CDP1~CPD15 connects two adjacent latch circuits of the plurality of latch circuits LC1~LC16. In some example embodiments, the open conduction loop may be formed by including all of the plurality of latch circuits LC1~LC16 and the plurality of defect detection conduction paths CDP1~CDP15; however, example embodiments are not limited thereto. For example, in some example embodiments, as will be described below with reference to FIGS. 22 through 32B, the open conduction loop may be formed by including a portion of the plurality of latch circuits LC1~LC16 and the plurality of defect detection conduction paths CDP1~CDP15.

Under the control of the test control circuit TCC, the test write operation may be performed by sequentially transferring bits of the input data pattern in the forward direction FDR of the open conduction loop so as to store the bits of the input data pattern in the plurality of latch circuits LC1~LC16 (S200). The test write operation will be further described below with reference to FIG. 4.

Under the control of the test control circuit TCC, the test read operation may be performed by transferring bits stored in the plurality of latch circuits LC1~LC16 in the backward direction BDR of the open conduction loop to read out the output data pattern (S300). The test read operation will be further described below with reference to FIG. 5.

The test control circuit TCC and/or the external tester may determine the defect detection conduction path including presence of or absence of a defect among the plurality of defect detection conduction paths DCP1~DCP15 by comparing the input data pattern and the output data pattern. The determination of the defect detection conduction path including the defect, that is, the determination of the defect position, will be described below with reference to FIGS. 6 through 8.

As such, the defect detection circuit, the semiconductor device including the defect detection circuit and the associated method according to some example embodiments may detect crack penetration of various types/various depths more thoroughly using the defect detection circuit including the plurality of latch circuits and the plurality of defect detection conduction paths. The defect detection circuit, the semiconductor device and the associated method according to some example embodiments may prevent or reduce the likelihood of yield impact from bad/defective semiconductor die or products, with enhanced detectability of the crack.

Figure 4:
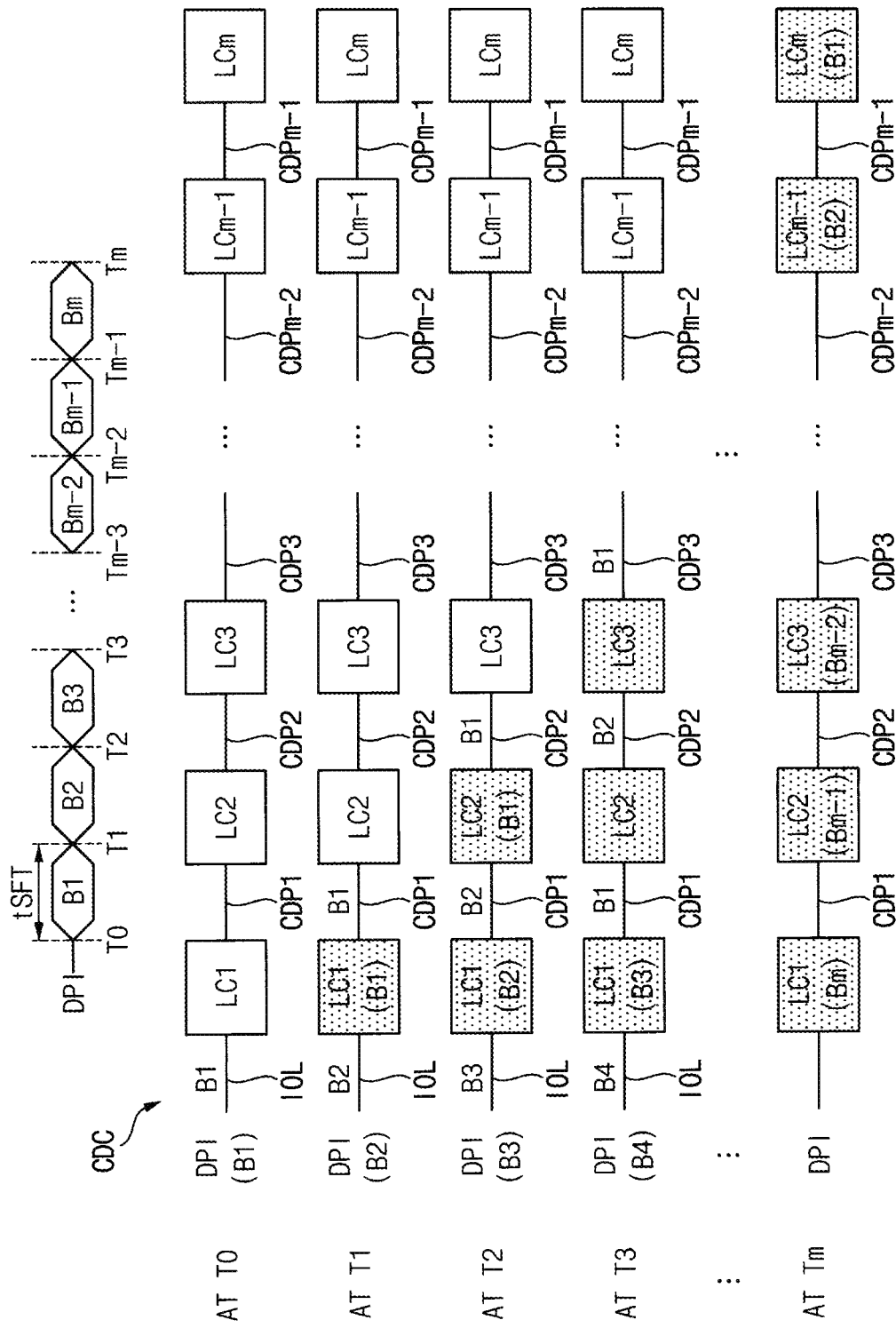
FIG. 4 is a diagram illustrating a test write operation of a defect detection circuit according to some example embodiments.
Figure 5:
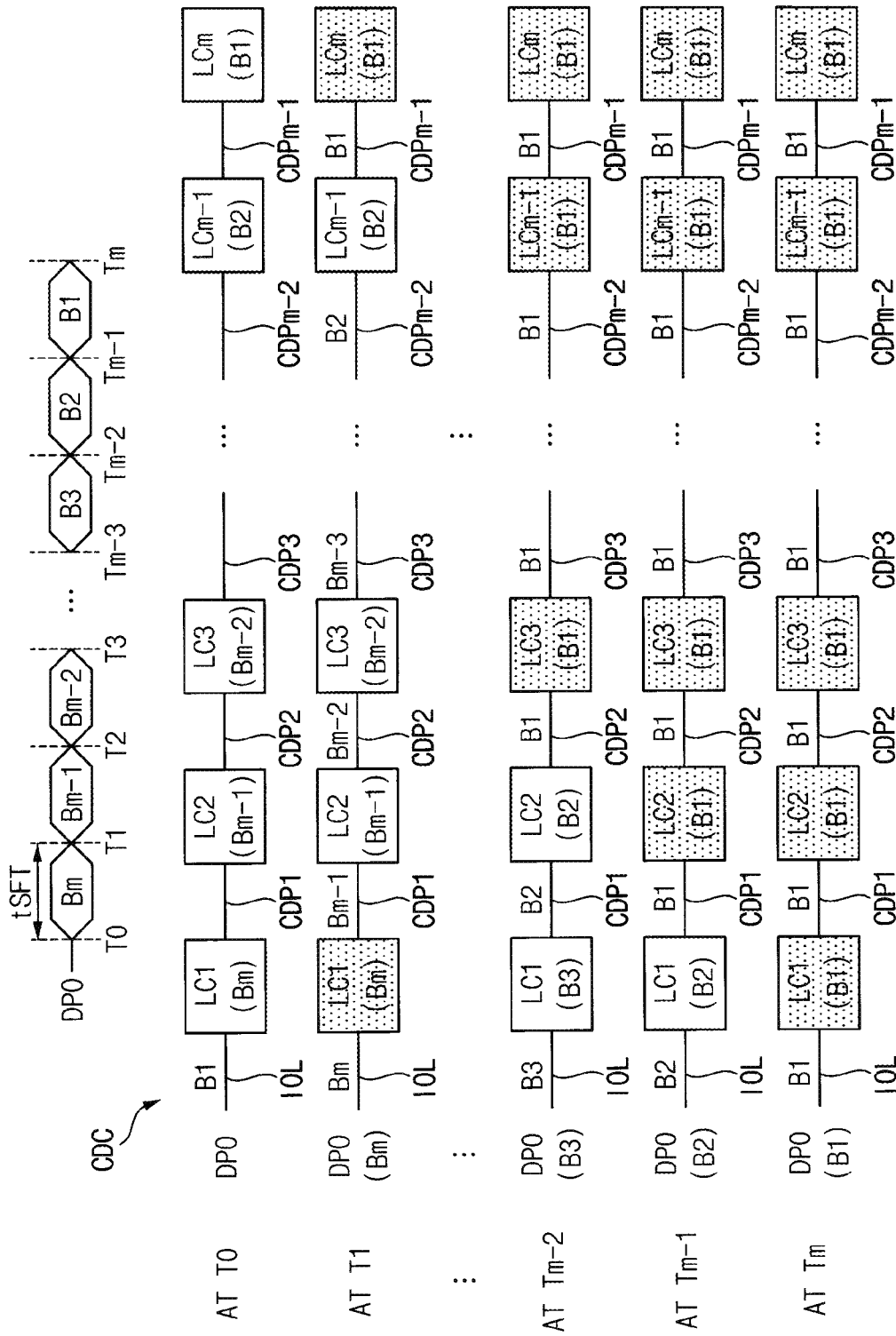
FIG. 5 is a diagram illustrating a test read operation of a defect detection circuit according to some example embodiments.

FIG. 4 is a diagram illustrating a test write operation of a defect detection circuit according to some example embodiments, and FIG. 5 is a diagram illustrating a test read operation of a defect detection circuit according to some example embodiments.

FIGS. 4 and 5 illustrate transfer of bits B1~Bm at time points T0~Tm of shifting period tSFT with respect to a defect detection circuit CDC including a plurality of latch circuits LC1~LCm and a plurality of defect detection conduction paths CDP1~CDPm−1 such that each defect detection conduction path connects two adjacent latch circuits. FIGS. 4 and 5 illustrate cases in which the defect detection circuit CDC does not include defects such as cracks. An input data pattern DPI, which is generated by the pattern generator PTT in FIG. 1 and provided to the defect detection circuit CDC during the test write operation, is illustrated in the upper portion of FIG. 4. The pattern generator PTT outputs each bit of the input data pattern DPI per shifting period tSFT corresponding to a bit transfer period between the two adjacent latch circuits. An output data pattern DPO, which is output from the defect detection circuit CDC and provided to the test control circuit TCC during the test read operation, is illustrated in the upper portion of FIG. 5.

Referring to FIG. 4, at time point T0 corresponding to a start time point of the test write operation, the pattern generator PTT applies the first bit B1 of the input data pattern DPI to the front node of the first latch circuit LC1 through the input-output line IOL.

At time point T1, the first latch circuit LC1 finishes latching of (storing of) the first bit B1 and applies the first bit B1 to the front node of the second latch circuit LC2 through the first defect detection conduction path CDP1 connecting the back node of the first latch circuit LC1 and the front node of the second latch circuit LC2. The pattern generator PTT applies the second bit B2 of the input data pattern DPI to the front node of the first latch circuit LC1 through the input-output line IOL.

At time point T2, the first latch circuit LC1 finishes latching of (storing of) the second bit B2 and applies the second bit B2 to the front node of the second latch circuit LC2 through the first defect detection conduction path CDP1. The second latch circuit LC2 finishes latching of the first bit B1 and applies the first bit B1 to the front node of the third latch circuit LC3 through the second defect detection conduction path CDP2 connecting the back node of the second latch circuit LC2 and the front node of the third latch circuit LC3. The pattern generator PTT applies the third bit B3 of the input data pattern DPI to the front node of the first latch circuit LC1 through the input-output line IOL.

At time point T3, the first latch circuit LC1 finishes latching of/storing of the third bit B3 and applies the third bit B3 to the front node of the second latch circuit LC2 through the first defect detection conduction path CDP1. The second latch circuit LC2 finishes latching of/storing of the second bit B2 and applies the second bit B2 to the front node of the third latch circuit LC3 through the second defect detection conduction path CDP2. The third latch circuit LC3 finishes latching of/storing of the first bit B1 and applies the first bit B1 to the front node of the fourth latch circuit LC4 through the third defect detection conduction path CDP3 connecting the back node of the third latch circuit LC3 and the front node of the fourth latch circuit LC4. The pattern generator PTT applies the fourth bit B4 of the input data pattern DPI to the front node of the first latch circuit LC1 through the input-output line IOL.

As such, the test write operation may be performed by sequentially/serially transferring the first through m-th bits B1~Bm of the input data pattern DPI in the forward direction FDR of the open conduction loop to store the first through m-th bits B1~Bm of the input data pattern DPI in the first through m-th latch circuits LC1~LCm.

At time point Tm corresponding to a finish time point of the test write operation, the m-th bit Bm is stored in the first latch circuit LC1, the (m−1)-th bit Bm−1 is stored in the second latch circuit LC2, in this way, the second bit B2 is stored in the (m−1)-th latch circuit LCm−1, and the first bit B1 is stored in the m-th latch circuit LCm.

Referring now to FIG. 5, time point T0 indicates a start time point of the test read operation.

At time point T1, the first latch circuit LC1 outputs the m-th bit Bm through the input-output line IOL, and the m-th through second bits Bm~B2 stored in the second through m-th latch circuits LC2~LCm is applied to the adjacent latch circuits in the backward direction BDR, respectively.

In this way, at time point Tm−2, the first latch circuit LC1 outputs the third bit B3 through the input-output line IOL, and the second bit B2 stored in the second latch circuit LC2 and the first bit B1 stored in the third through m-th latch circuits LC3~LCm are applied to the adjacent latch circuits in the backward direction BDR, respectively.

At time point Tm−1, the first latch circuit LC1 outputs the second bit B2 through the input-output line IOL, and the first bit B1 stored in the second through m-th latch circuits LC2~LCm is applied to the adjacent latch circuits in the backward direction BDR, respectively.

At time point Tm, the first latch circuit LC1 finishes outputting of the first bit B1 through the input-output line IOL.

As such, the test read operation may be performed by transferring the m-th through first bits Bm~B1 stored in the first through m-th latch circuits LC1~LCm in the backward direction BDR of the open conduction loop to read out the output data pattern DPO.

At time point Tm corresponding to a finish time point of the test read operation, all of the first through m-th latch circuits LC1~LCm store the first bit B1, because the first bit B1 stored in the m-th latch circuit LCm at time point T0 is propagated sequentially/serially to the adjacent latch circuit in the backward direction BDR per shifting period tSFT.

Figure 6:
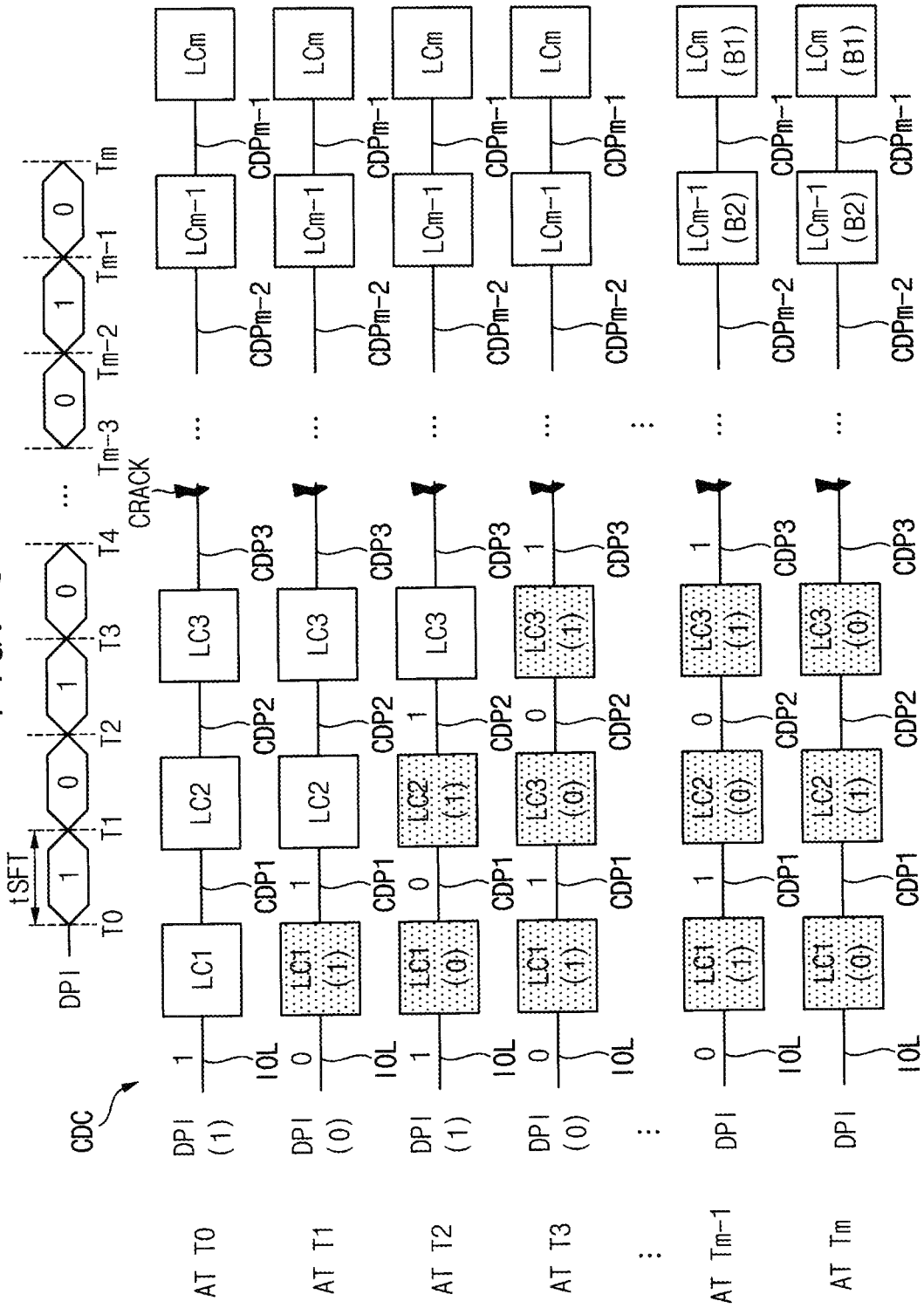
FIG. 6 is a diagram illustrating an example of a test write operation of a defect detection circuit according to some example embodiments.
Figure 7:
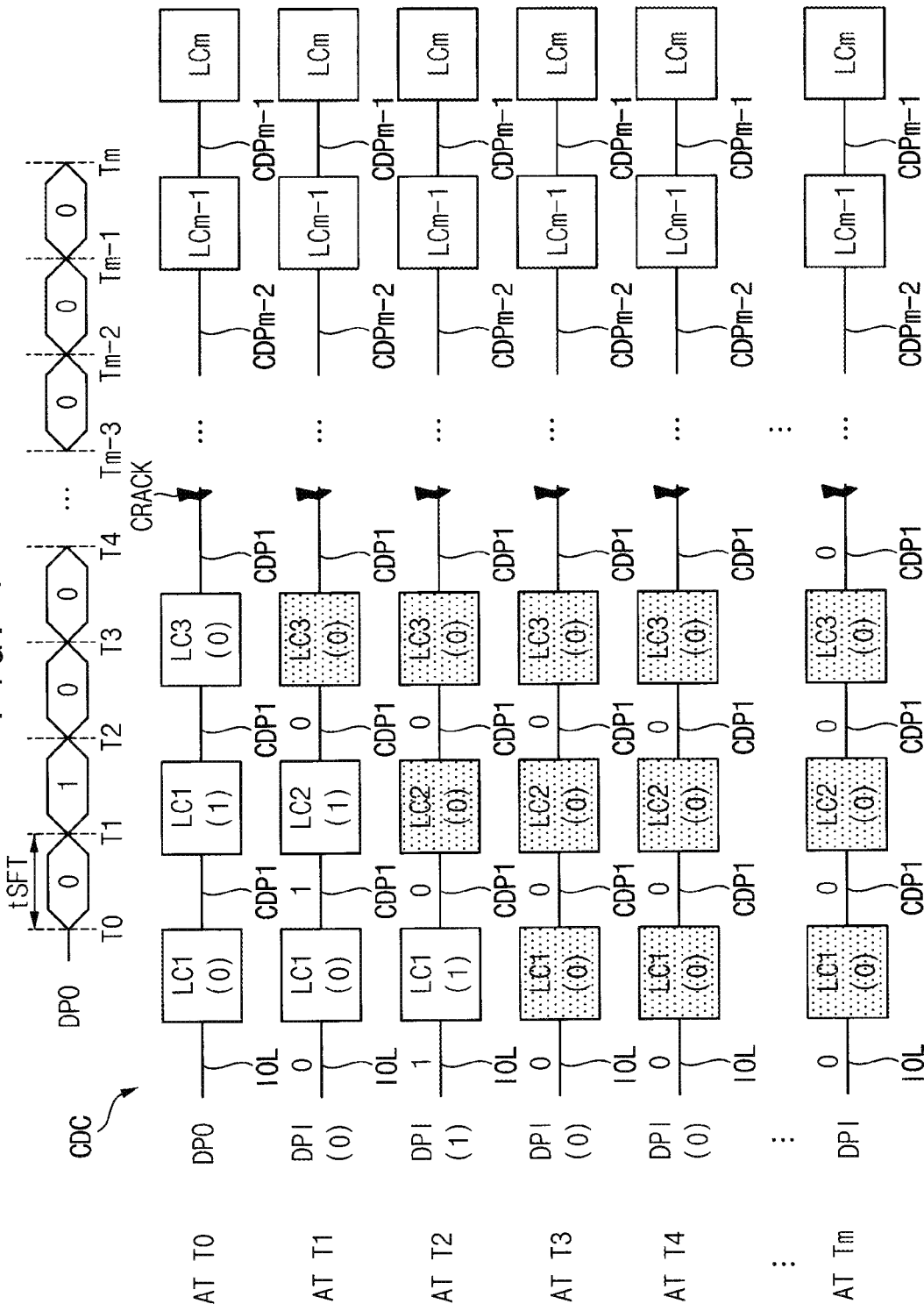
FIG. 7 is a diagram illustrating an example of a test read operation of a defect detection circuit according to some example embodiments.

FIG. 6 is a diagram illustrating an example of a test write operation of a defect detection circuit according to some example embodiments, and FIG. 7 is a diagram illustrating an example of a test read operation of a defect detection circuit according to some example embodiments. The test write operation of FIG. 6 is substantially the same as the descriptions of FIG. 4, the test read operation of FIG. 7 is substantially the same as the descriptions of FIG. 5, and the repeated descriptions are omitted for brevity.

FIGS. 4 and 5 illustrate cases that a defect, e.g. a crack is present/has occurred in the defect detection circuit CDC, for example, in the third defect detection conduction path CDP3 connecting the third latch circuit LC3 and the fourth latch circuit LC4. As an example, the input data pattern DPI may include the odd-numbered bits having the value of 1 and the even-numbered bits having the value of 0.

As illustrated in FIG. 6, the bits of the input data pattern DPI may not transferred to the fourth through m-th latch circuits LC4~LCm during the test write operation because of the defect in the third defect detection conduction path CDP3. For example, the defect in the third defect detection conduction path CDP3 may stop or disallow transfer of bits from latch circuit LC3 to latch circuit LC4. As a result, at time point Tm corresponding to the finish time point of the test write operation, the first latch circuit LC1 stores the m-th bit of 0, the second latch circuit LC2 stores the (m−1)-th bit of 1, and the third latch circuit LC3 stores the (m−2)-th bit of 0.

As illustrated in FIG. 7, according to the test read operation, the first latch circuit LC1 outputs the m-th bit of 0 at time point T1, the (m−1)-th bit of 1 at time point T2, and the (m−2)-th bit of 0 at time point T3. At time points T4~Tm, the first latch circuit LC1 outputs repeatedly the (m−2)-th bit of 0 that is stored in the third latch circuit LC3 located just before the third defect detection conduction path CDP3 including the defect.

Accordingly, the bits of the output data pattern DPO may be different from the bits of the input data pattern DPI at time points T4~Tm, due to the defect/crack in the third defect detection conduction path CDP3. As such, the test control circuit TCC and/or the external tester may determine, the location of the defect, e.g. the defect detection conduction path including the defect among the plurality of defect detection conduction paths CDP1~CDPm−1 by comparing the input data pattern DPI and the output data pattern DPO.

Figure 8A:
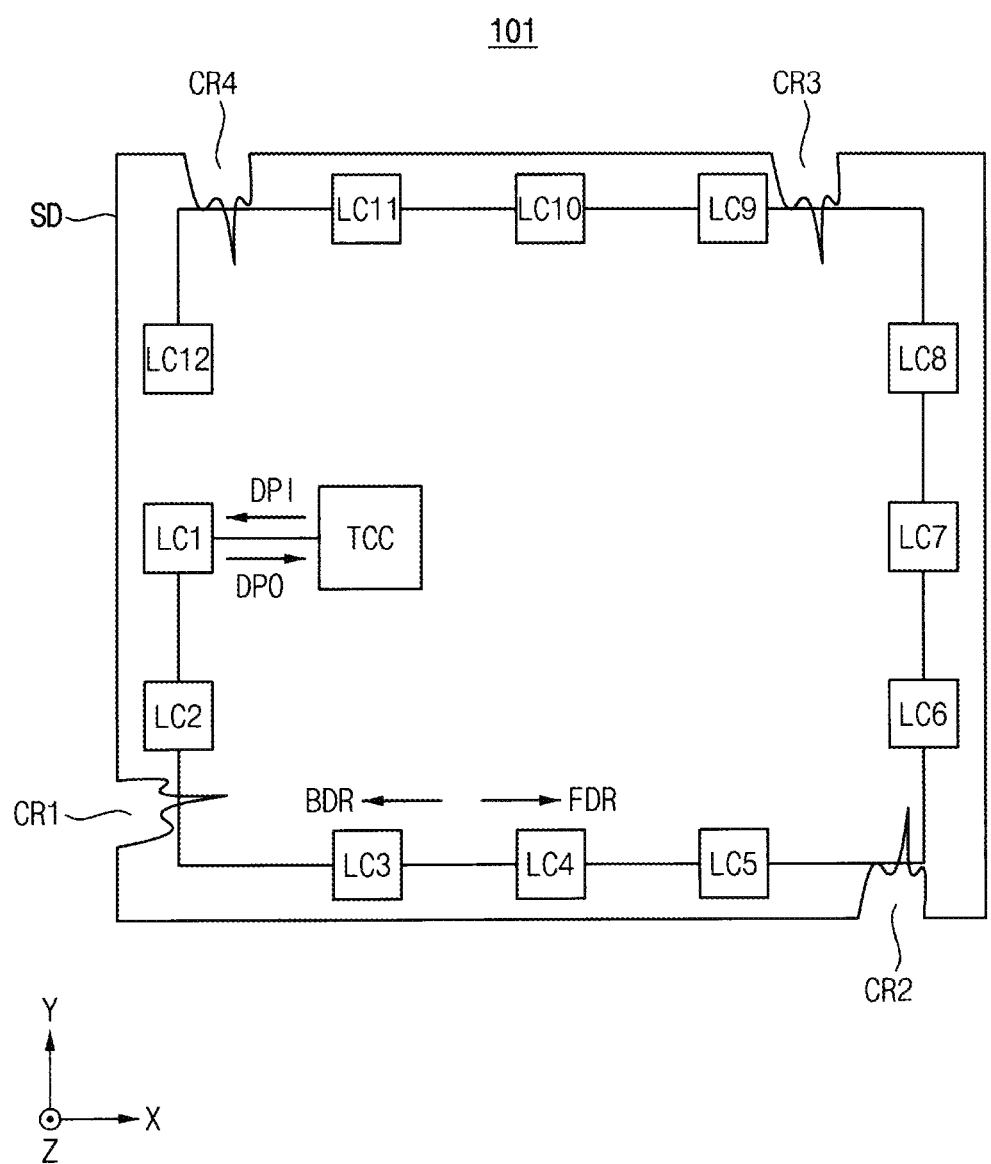

FIGS. 8A and 8B are diagrams for describing defect detection in a semiconductor device according to some example embodiments.

Referring to FIG. 8A, a defect detection circuit of a semiconductor device 101 may include a plurality of latch circuits LC1~LC12 and a plurality of defect detection conduction paths such that each defect detection conduction path of the plurality of defect detection conduction paths CDP1~CDP11 connects two adjacent latch circuits of the plurality of latch circuits. The plurality of latch circuits LC1~LC12 and the plurality of defect detection conduction paths may form an open conduction loop. FIG. 8A illustrates the twelve latch circuits LC1~LC12 arranged in a counter-clockwise fashion and the eleven defect detection conduction paths for convenience of illustration, and the number of/direction of the latch circuits and the number of/direction of the defect detection conduction path may be determined variously.

Defects, e.g. cracks of various locations may be present/may have occurred, for example, during a process of lapping and/or dicing/or sawing a semiconductor wafer. A first crack CR1 indicates a defect near the left-bottom corner region, a second crack CR2 indicates a defect near the right-bottom corner region, a third crack CR3 indicates a defect near the right-upper corner region, and a fourth crack CR4 indicates a defect near the left-upper corner region.

Referring to FIGS. 8A and 8B, the test control circuit TCC may perform the test write operation and the test read operation as described above. The test write operation may be performed by sequentially/serially transferring the first through twelfth bits B1~B12 of the input data pattern DPI in the forward direction FDR of the open conduction loop to store the first through twelfth bits B1~B12 of the input data pattern DPI in the first through twelfth latch circuits LC1~LC12. The test read operation may be performed by transferring the bits stored in the first through twelfth latch circuits LC1~LC12 in the backward direction BDR of the open conduction loop to read out the output data pattern DPO.

When the first crack CR1 has occurred/is present, the eleventh and twelfth bits B11 and B12 of the output data pattern DPO are equal to the eleventh and twelfth bits B11 and B12 of the input data pattern DPI but the first through tenth bits B11 of the output data pattern DPO are different from the first through tenth bits B1~B10 of the input data pattern DPI. Thus it may be determined that the defect has occurred/is present in the defect detection conduction path between the second latch circuit LC2 and the third latch circuit LC3.

When the second crack CR2 has occurred/is present, the eighth through twelfth bits B8~B12 of the output data pattern DPO are equal to the eighth through twelfth bits B8~B12 of the input data pattern DPI but the first through seventh bits B8 of the output data pattern DPO are different from the first through seventh bits B1~B7 of the input data pattern DPI. Thus it may be determined that the defect has occurred/is present in the defect detection conduction path between the fifth latch circuit LC5 and the sixth latch circuit LC6.

When the third crack CR3 is present, the fifth through twelfth bits B5~B12 of the output data pattern DPO are equal to the fifth through twelfth bits B5~B12 of the input data pattern DPI but the first through fourth bits B5 of the output data pattern DPO are different from the first through fourth bits B1~B4 of the input data pattern DPI. Thus it may be determined that the defect has occurred/is present in the defect detection conduction path between the eighth latch circuit LC8 and the ninth latch circuit LC9.

When the fourth crack CR4 is present/has occurred, the second through twelfth bits B2~B12 of the output data pattern DPO are equal to the second through twelfth bits B2~B12 of the input data pattern DPI but the first bit B2 of the output data pattern DPO is different from the first bit B1 of the input data pattern DPI. Thus it may be determined that the defect is present/has occurred in the defect detection conduction path between the eleventh latch circuit LC11 and the twelfth latch circuit LC12.

As such, the semiconductor device including the defect detection circuit and the associated method may determine the location of the defect in addition to the occurrence of (presence of) the defect, using the defect detection circuit including the plurality of latch circuits and the defect detection conduction paths forming the open conduction loop.

Figure 9:
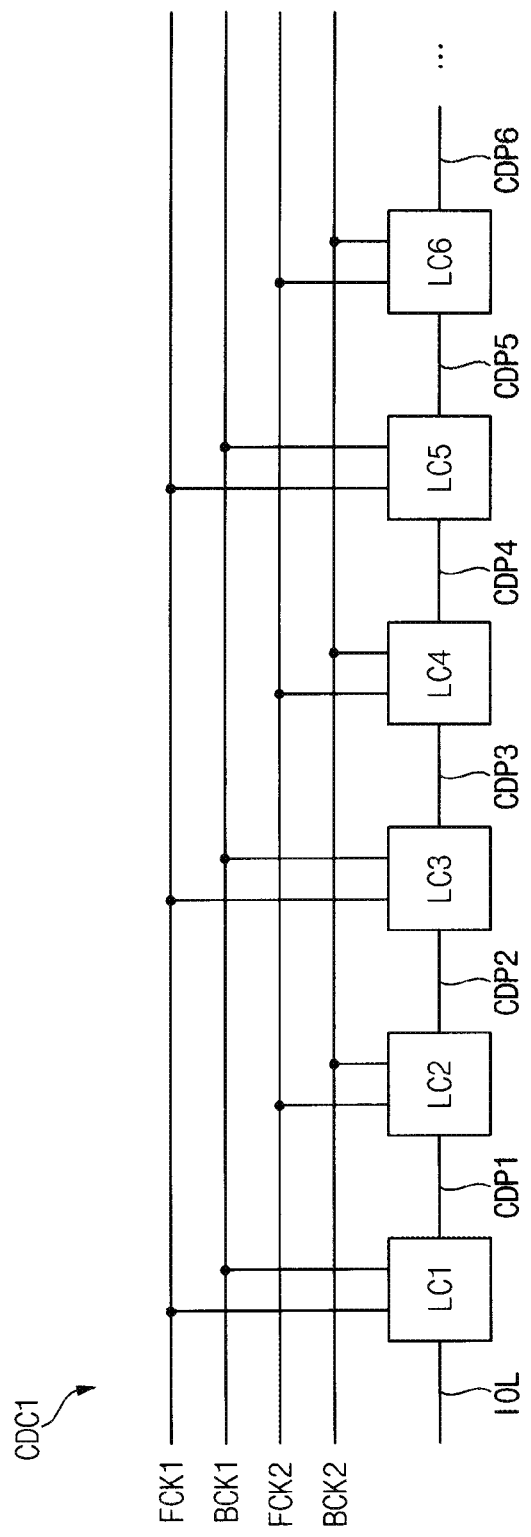
FIG. 9 is a diagram illustrating a defect detection circuit according to some example embodiments.

FIG. 9 is a diagram illustrating a defect detection circuit according to some example embodiments.

Referring to FIG. 9, a defect detection circuit CDC1 may include a plurality of latch circuits LC1~LC6 and a plurality of defect detection conduction paths CDP1~CDP6 such that each defect detection conduction path connects the two adjacent latch circuits. As described above with reference to FIG. 1, the defect detection circuit CDC1 may be disposed in the peripheral region PREG of the semiconductor die SD to form an open conduction loop.

The test control circuit TCC in FIG. 1 may perform the test write operation by sequentially/serially transferring the bits of the input data pattern DPI in the forward direction FDR of the open conduction loop so as to store the bits of the input data pattern DPI in the plurality of latch circuits LC1~LC6 and the test read operation by transferring bits stored in the plurality of latch circuits LC1~LC6 in the backward direction BDR of the open conduction loop to read out the output data pattern DPO.

The clock generator CGEN in FIG. 1 may generate a first forward clock signal FCK1, a second forward clock signal FCK2, a first backward clock signal BCK1 and a second backward clock signal BCK2. The first forward clock signal FCK1 and the first backward clock signal BCK1 may be applied to the odd-numbered latch circuits LC1, LC3 and LC5, and the second forward clock signal FCK2 and the second backward clock signal BCK2 may be applied to the even-numbered latch circuits LC2, LC4 and LC6.

Figure 10:
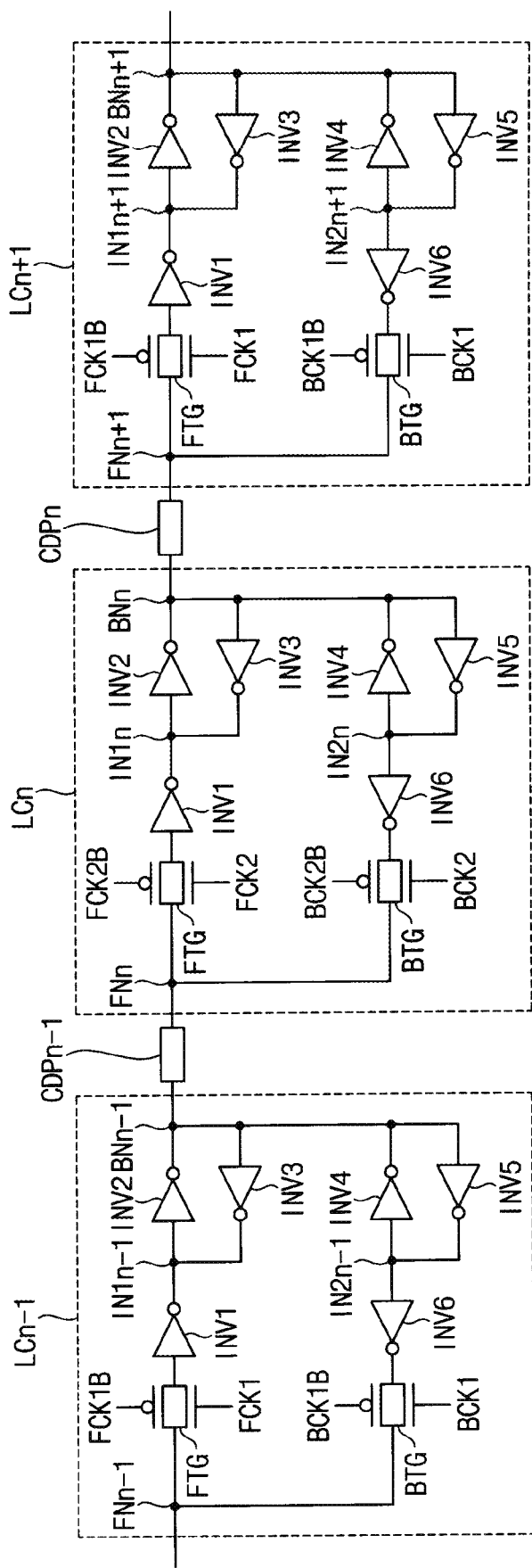
FIG. 10 is a circuit diagram illustrating an example embodiment of latch circuits included in the defect detection circuit of FIG. 9.

FIG. 10 is a circuit diagram illustrating an example embodiment of latch circuits included in the defect detection circuit of FIG. 9.

FIG. 10 illustrates a portion of a defect detection circuit CDC1 corresponding to the three adjacent latch circuits LCn−1, LCn and LCn+1, and the two defect detection conduction paths CDPn−1 and CDPn connecting the three adjacent latch circuits LCn−1, LCn and LCn+1. The (n−1)-th and (n+1)-th latch circuits LCn−1 and LCn+1 correspond to the odd-numbered latch circuits receiving the first forward clock signal FCK1 and the first backward clock signal BCK1, and the n-th latch circuit LCn corresponds to the even-numbered latch circuit receiving the second forward clock signal FCK2 and the second backward clock signal BCK2.

Referring to FIG. 10, each latch circuit LCi (i=n−1, n, or n+1) includes a forward transfer gate FTG connected to a front node FNi, a first inverter INV1 having an input node connected to the forward transfer gate FTG and an output node connected to a first intermediate node IN1$i$, a second inverter INV2 having an input node connected to the first intermediate node IN1$i$ and an output node connected to a back node BNi, a third inverter INV3 having an input node connected to the back node BNi and an output node connected to the first intermediate node IN1$i$, a backward transfer gate BTG connected to the front node FNi, a fourth inverter INV4 having an input node connected to a second intermediate node IN2$i$ and an output node connected to the back node BNi, a fifth inverter INV5 having an input node connected to the back node BNi and an output node connected to the second intermediate node IN2$i$, and a sixth inverter INV6 having an input node connected to the second intermediate node IN2$i$ and an output node connected to the backward transfer gate BTG.

The first forward clock signal FCK1 may be applied to the forward transfer gate FTG of the odd-numbered latch circuits LCn−1 and LCn+1, and the second forward clock signal FCK2 may be applied to the forward transfer gate FTG of the even-numbered latch circuit LCn. The first backward clock signal BCK1 may be applied to the backward transfer gate BTG of the odd-numbered latch circuits LCn−1 and LCn+1, and the second backward clock signal BCK2 may be applied to the backward transfer gate BTG of the even-numbered latch circuit LCn. Clock signals FCK1B, FCK2B, BCK1B and BCK2B are inverted clock signals (e.g. 180 degrees out-of-phase) of the clock signals FCK1, FCK2, BCK1 and BCK2, respectively. The inverted clock signals FCK1B, FCK2B, BCK1B and BCK2B may be generated using inverters (not shown) in the defect detection circuit CDC1 and/or may be generated by the clock generator CGEN in FIG. 1.

Figure 11A:
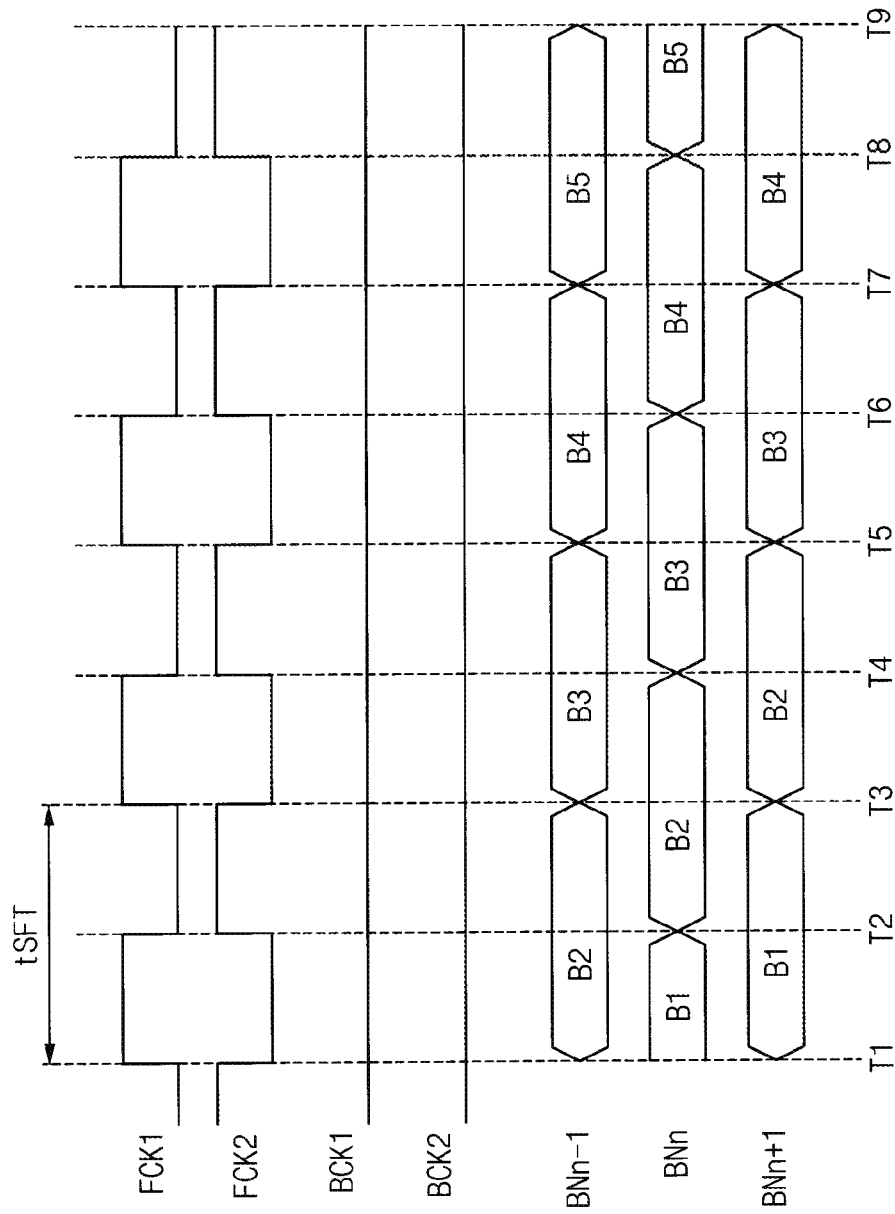
FIGS. 11A, 11B and 12 are timing diagrams illustrating operations of the defect detection circuit of FIG. 9.
Figure 11B:
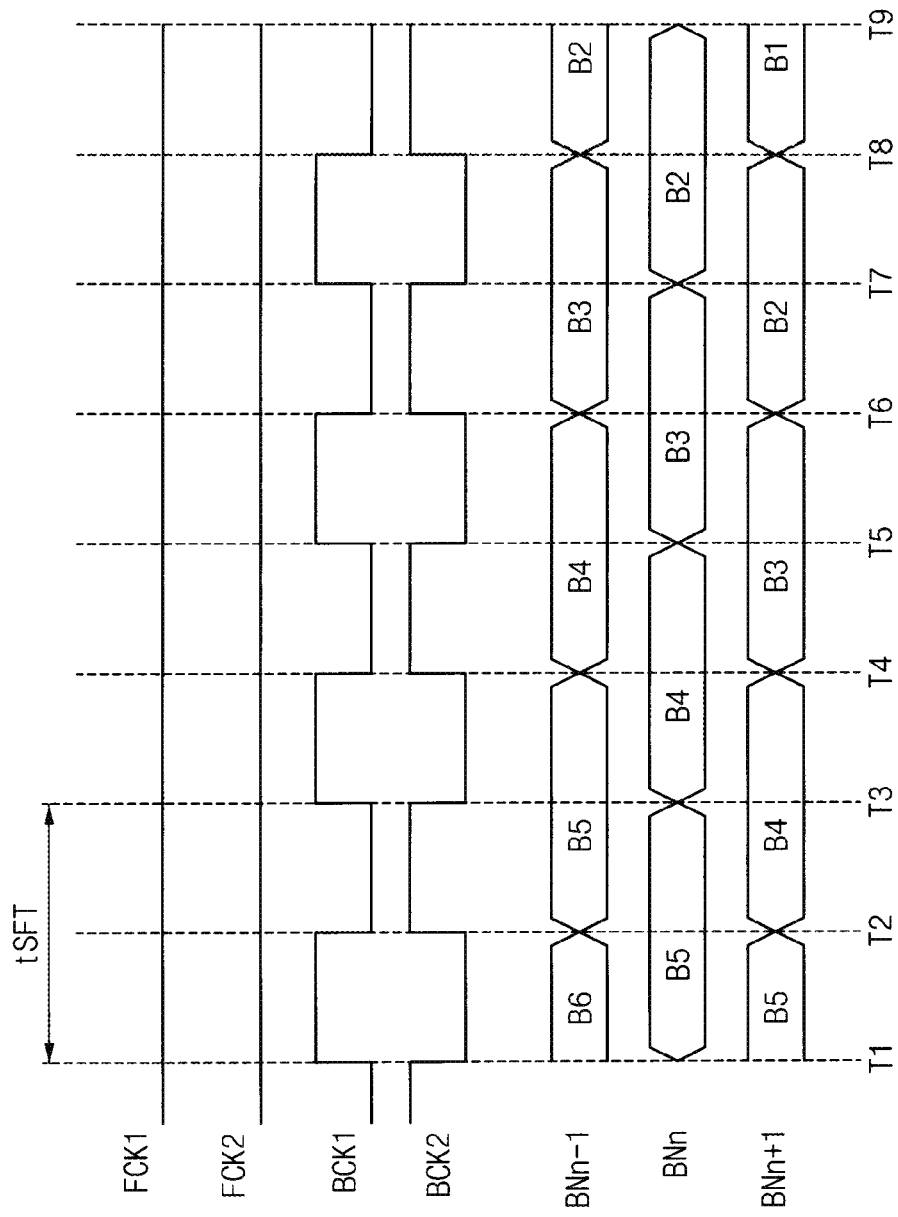
Figure 12:
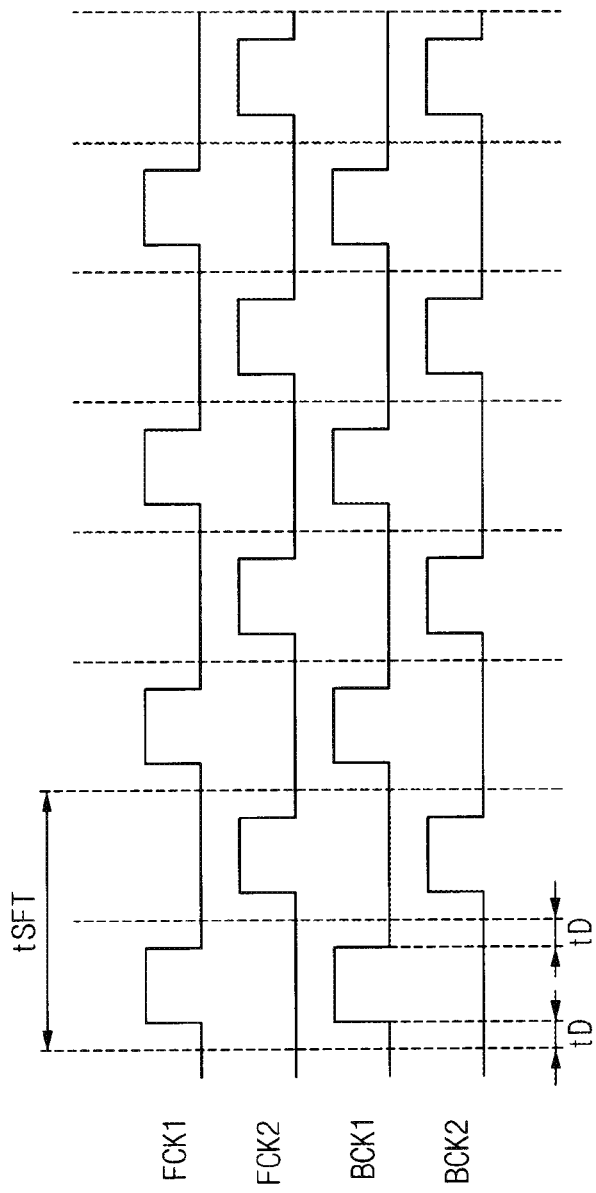

FIGS. 11A, 11B and 12 are timing diagrams illustrating operations of the defect detection circuit of FIG. 9.

FIG. 11A illustrates the test write operation of the defect detection circuit CDC1 and FIG. 11B illustrates the test read operation of the defect detection circuit CDC1. FIGS. 11A and 11B illustrate the bits B1~B6 that are latched at the back node BNn−1 of the (n−1)-th latch circuit LCn−1, the back node BNn of the n-th latch circuit LCn and the back node BNn+1 of the (n+1)-th latch circuit LCn+1 at time points T1~T9. The time points T1~T9 have an interval corresponding a half of the shifting period tSFT.

Referring to FIG. 11A, the clock generator CGEN in the test control circuit TCC in FIG. 1 may activate the first forward clock signal FCK1 and the second forward clock signal FCK2 to have opposite phases (180 degrees out-of-phase) and may deactivate the first backward clock signal BCK1 and the second backward clock signal BCK2 during the test write operation. As a result, as illustrated in FIG. 11A, the bits B1~B6 may be transferred sequentially/serially per shifting period tSFT, from the back node BNn−1 of the (n−1)-th latch circuit LCn−1 to the back node BNn of the n-th latch circuit LCn, and then from the back node BNn of the n-th latch circuit LCn to the back node BNn+1 of the (n+1)-th latch circuit LCn+1. For example, the bits B1~B6 of the input data pattern DPI may be transferred sequentially/serially in the forward direction FDR of the open conduction loop during the test write operation.

Referring to FIG. 11B, the clock generator CGEN may activate the first backward clock signal BCK1 and the second backward clock signal BCK2 to have opposite phases (180 degrees out-of-phase) and may deactivate the first forward clock signal FCK1 and the second forward clock signal FCK2 during the test read operation. As a result, as illustrated in FIG. 11B, the bits B1~B6 may be transferred sequentially/serially per shifting period tSFT, from the back node BNn+1 of the (n+1)-th latch circuit LCn+1 to the back node BNn of the n-th latch circuit LCn, and then from the back node BNn of the n-th latch circuit LCn to the back node BNn−1 of the (n−1)-th latch circuit LCn−1. For example, the bits B1~B6 stored in the latch circuits may be transferred sequentially/serially in the backward direction BDR of the open conduction loop and may be read out as the output data pattern DPO during the test read operation.

FIG. 12 illustrates that a dead time interval 2*tD is implemented between the edges of the first forward clock signal FCK1 and the first backward clock signal BCK1, and between the edges of the second forward clock signal FCK2 and the second backward clock signal BCK2. By using such dead time interval 2*tD, accuracy of the defect detection may be enhanced by preventing/reducing the likelihood of the forward transfer gate FTG and the backward transfer gate BTG of the two adjacent latch circuits from being turned on simultaneously.

Figure 13:
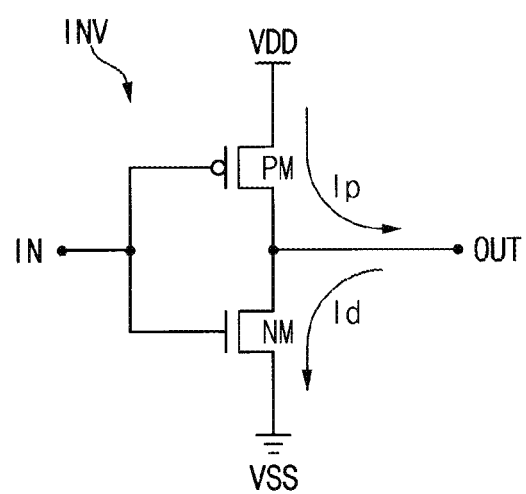
FIG. 13 is a circuit diagram illustrating an inverter included in the latch circuits of FIG. 10.

FIG. 13 is a circuit diagram illustrating an inverter included in the latch circuits of FIG. 10.

In some example embodiments, the first through sixth inverters INV1~INV6 in FIG. 10 may be implemented as a normal inverter INV, e.g. a normal CMOS inverter, as illustrated in FIG. 13. The normal inverter INV may include a p-type metal oxide semiconductor (PMOS) transistor PM and an n-type metal oxide semiconductor (NMOS) transistor NM, which together invert an input signal IN to output an output signal OUT. When the input signal IN is in the low level (e.g. "0"), the PMOS transistor PM is turned on and the output signal OUT is pulled up by the pull-up current Ip flowing from the power supply voltage VDD. When the input signal IN is in the high level (e.g. "1"), the NMOS transistor NM is turned on and the output signal OUT is pulled down by the pull-down current Id flowing to the ground voltage VSS. The currents Ip and Id may be based on, e.g. proportional to, the sizes and/or widths and/or the aspect ratios of the transistors PM and NM.

Figure 14A:
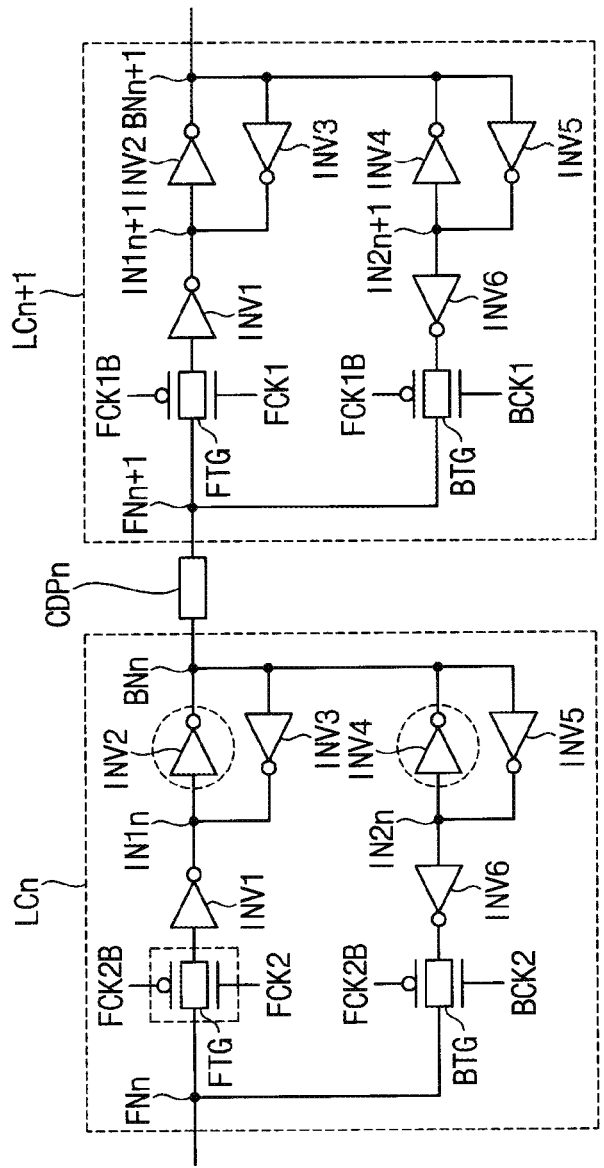
FIGS. 14A and 14B are diagrams for describing operations of the latch circuits of FIG. 10.
Figure 14B:
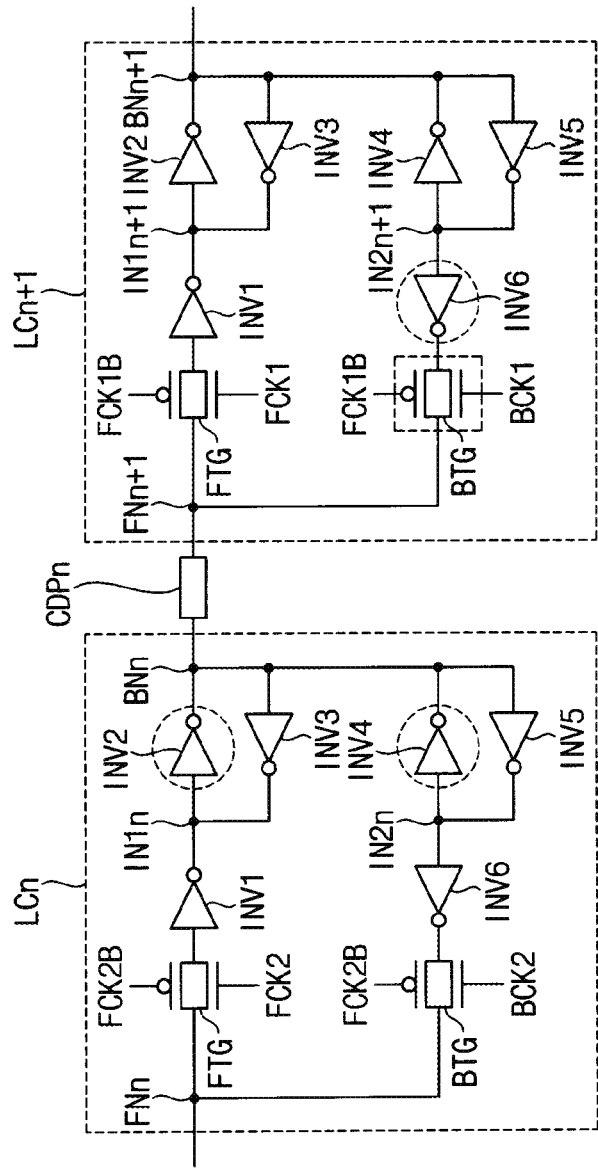

FIGS. 14A and 14B are diagrams for describing operations of the latch circuits of FIG. 10.

FIG. 14A illustrates a case that the forward transfer gate FTG of the even-numbered latch circuit LCn is turned on during the test write operation. For example, the case of FIG. 14A corresponds to the time interval T2~T3 in FIG. 11A. During the time interval T2~T3, only the forward transfer gate FTG of the even-numbered latch circuit LCn is turned on, and the backward transfer gate BTG of the even-numbered latch circuit LCn and the forward and backward transfer gates FTG and BTG of the odd-numbered latch circuit LCn+1 are turned off.

As a result, during the time interval T2~T3 in FIG. 11A, the bit of the front node FNn of the latch circuit LCn may be transferred to the back node BNn of the latch circuit LCn, and the sizes of/drive currents of/electrical characteristics of the second inverter INV2 and the fourth inverter INV4 represented by the dotted circles may affect the bit transfer. The size of//drive currents of/electrical characteristics of the second and fourth inverters INV2 and INV4 may be set to be greater than the size/drive current of the third and fifth inverters INV3 and INV5, and thus bit transfer in the forward direction FDR may be more dominant than bit transfer in the backward direction BDR.

FIG. 14B illustrates a case that the backward transfer gate BTG of the odd-numbered latch circuit LCn+1 is turned on during the test read operation. For example, the case of FIG. 14B corresponds to the time interval T1~T2 in FIG. 11B. During the time interval T1~T2, only the backward transfer gate BTG of the odd-numbered latch circuit LCn+1 is turned on, and the forward transfer gate FTG of the odd-numbered latch circuit LCn+1 and the forward and backward transfer gates FTG and BTG of the even-numbered latch circuit LCn are turned off.

As a result, during the time interval T1~T2 in FIG. 11B, the bit of the back node BNn+1 of the latch circuit LCn+1 is transferred to the front node FNn+1 of the latch circuit LCn+1, and the sizes of/drive currents of/electrical performance of the second inverter INV2 and the fourth inverter INV4 of the Latch circuit LCn and the sixth inverter INV6 of the latch circuit LCn+1 represented by the dotted circles affect the bit transfer. The size of/drive current of/electrical performance of the sixth inverter INV6 may be set to be greater than the sum of the sizes of the second and fourth inverters INV2 and INV4, and thus bit transfer in the backward direction BDR may be more dominant than bit transfer in the forward direction FDR.

Figure 15:
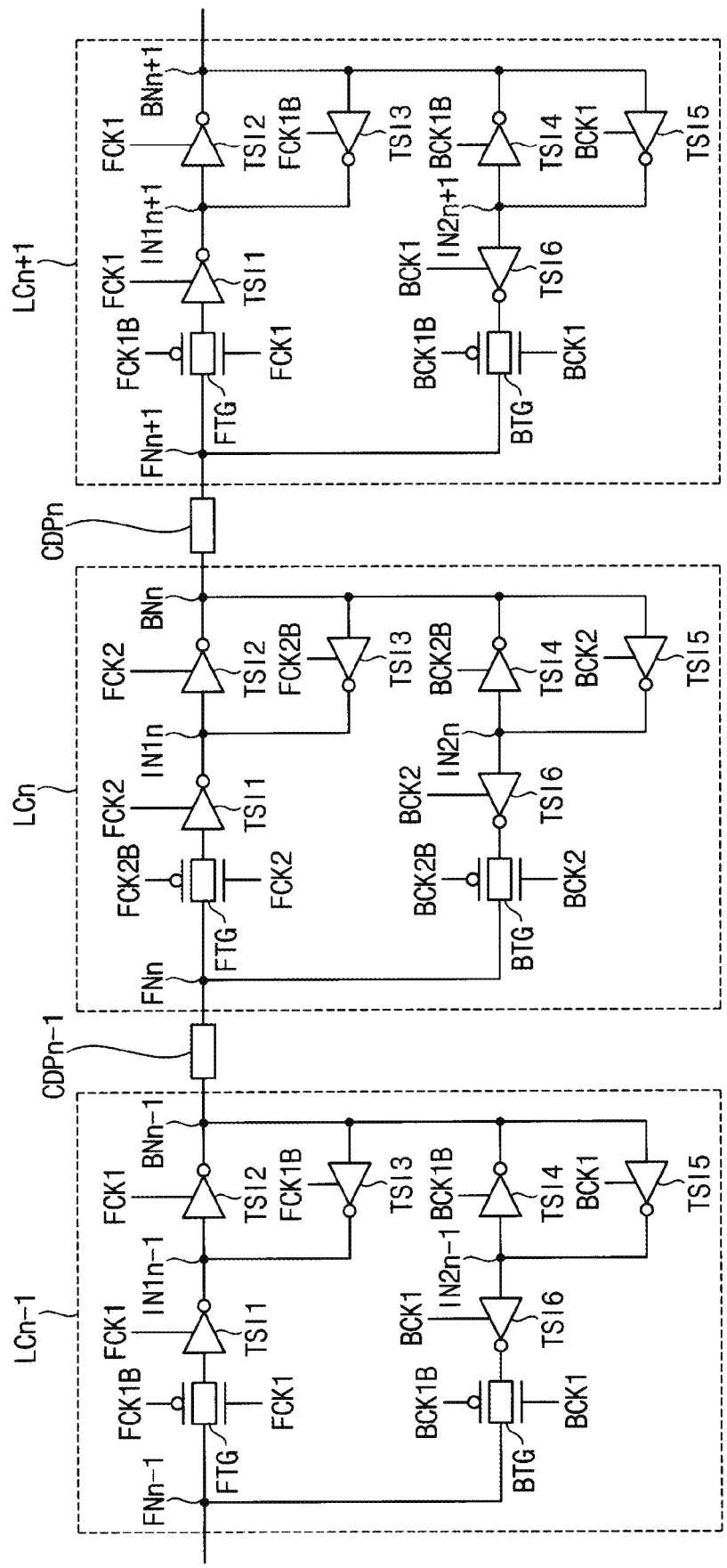
FIG. 15 is a circuit diagram illustrating an example embodiment of latch circuits included in the defect detection circuit of FIG. 9.

FIG. 15 is a circuit diagram illustrating an example embodiment of latch circuits included in the defect detection circuit of FIG. 9.

FIG. 15 illustrates a portion of a defect detection circuit CDC1 corresponding to the three adjacent latch circuits LCn−1, LCn and LCn+1, and the two defect detection conduction paths CDPn−1 and CDPn connecting the three adjacent latch circuits LCn−1, LCn and LCn+1. The (n−1)-th and (n+1)-th latch circuits LCn−1 and LCn+1 correspond to the odd-numbered latch circuits receiving the first forward clock signal FCK1 and the first backward clock signal BCK1, and the n-th latch circuit LCn corresponds to the even-numbered latch circuit receiving the second forward clock signal FCK2 and the second backward clock signal BCK2.

Referring to FIG. 15, each latch circuit LCi (i=n−1, n, or n+1) includes a forward transfer gate FTG connected to a front node FNi, a first tri-state inverter TSI1 having an input node connected to the forward transfer gate FTG and an output node connected to a first intermediate node IN1$i$, a second tri-state inverter TSI2 having an input node connected to the first intermediate node IN1$i$ and an output node connected to a back node BNi, a third tri-state inverter TSI3 having an input node connected to the back node BNi and an output node connected to the first intermediate node IN1$i$, a backward transfer gate BTG connected to the front node FNi, a fourth tri-state inverter TSI4 having an input node connected to a second intermediate node IN2$i$ and an output node connected to the back node BNi, a fifth tri-state inverter TSI5 having an input node connected to the back node BNi and an output node connected to the second intermediate node IN2$i$, and a sixth tri-state inverter TSI6 having an input node connected to the second intermediate node IN2$i$ and an output node connected to the backward transfer gate BTG.

The first forward clock signal FCK1 may be applied to the forward transfer gate FTG of the odd-numbered latch circuits LCn−1 and LCn+1, and the second forward clock signal FCK2 may be applied to the forward transfer gate FTG of the even-numbered latch circuit LCn. The first backward clock signal BCK1 may be applied to the backward transfer gate BTG of the odd-numbered latch circuit LCn−1 and LCn+1, and the second backward clock signal BCK2 may be applied to the backward transfer gate BTG of the even-numbered latch circuit LCn. Clock signals FCK1B, FCK2B, BACK1B and BCK2B are inverted clock signals of the clock signals FCK1, FCK2, BCK1 and BCK2, respectively. The inverted clock signals FCK1B, FCK2B, BCK1B and BCK2B may be generated using inverters (not shown) in the defect detection circuit CDC1 or may be generated by the clock generator CGEN in FIG. 1.

The first through sixth tri-state inverters TSI1~TSI6 may receive one of the clock signals FCK1, FCK2, BCK1 and BCK2 and the inverted clock signals FCK1B, FCK2B, BCK1B and BCK2B, respectively, as illustrated in FIG. 15. The first through sixth tri-state inverters TSI1~TSI6 may be enabled in response to the corresponding one of the clock signals FCK1, FCK2, BCK1 and BCK2 and the inverted clock signals FCK1B, FCK2B, BCK1B and BCK2B.

Figure 16:
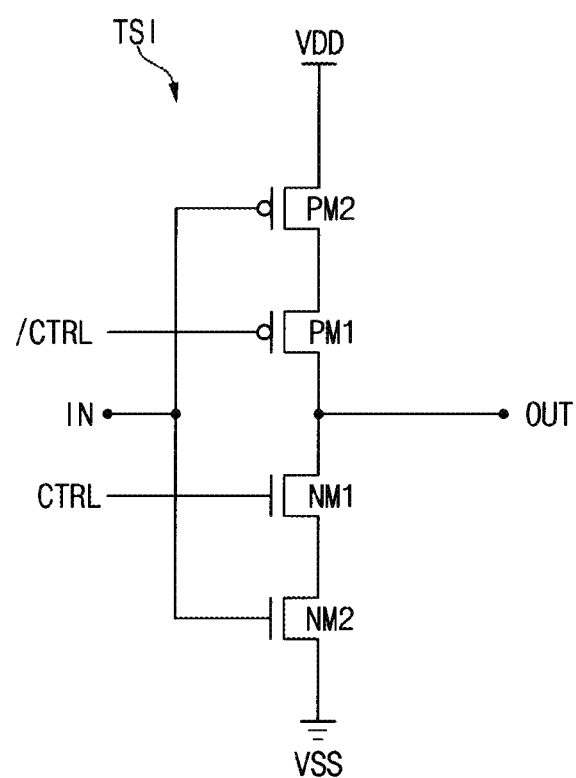
FIG. 16 is a circuit diagram illustrating a tri-state inverter included in the latch circuits of FIG. 15.

FIG. 16 is a circuit diagram illustrating a tri-state inverter included in the latch circuits of FIG. 15.

Referring to FIG. 16, a tri-state inverter TSI may include a first PMOS transistorPM1, a second PMOS transistor PM2, a first NMOS transistor NM1, and a second NMOS transistor NM2, which are serially connected between the power supply voltage VDD and the ground voltage VSS.

When an enable signal CTRL is in the logic low level (e.g. logic "0"), the node of the output signal OUT is floated regardless of the input signal IN and the tri-state inverter TSI is disabled. A clock signal /CTRL is an inverted signal of the enable signal CTRL. When an enable signal CTRL is in the logic high level (e.g. logic "1"), the tri-state inverter TSI is enabled to output the output signal OUT by inverting the input signal IN. The first through sixth tri-state inverters TSH~TSI6 may receive, as the enable signal CTRL, the corresponding one of the clock signals FCK1, FCK2, BCK1 and BCK2 and the inverted clock signals FCK1B, FCK2B, BCK1B and BCK2Bas illustrated in FIG. 15.

Figure 17A:
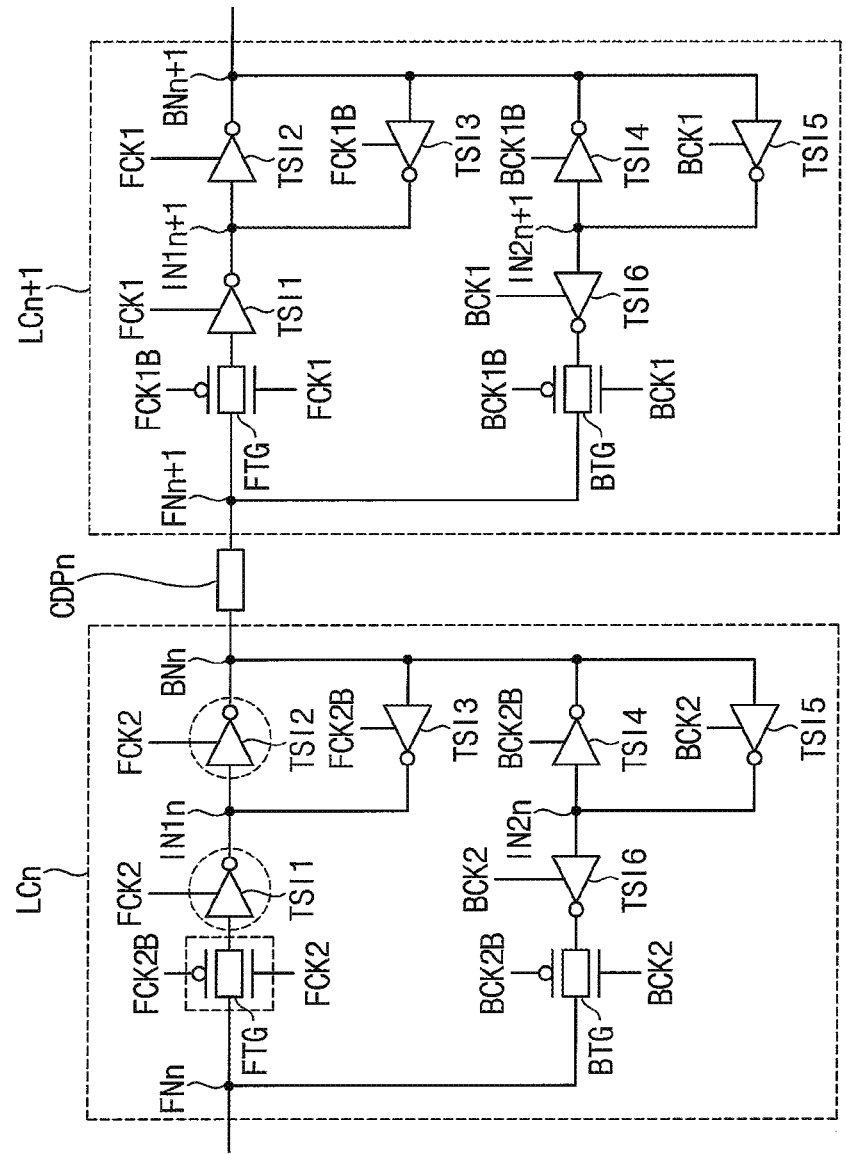
FIGS. 17A and 17B are diagrams for describing operations of the latch circuits of FIG. 15.
Figure 17B:
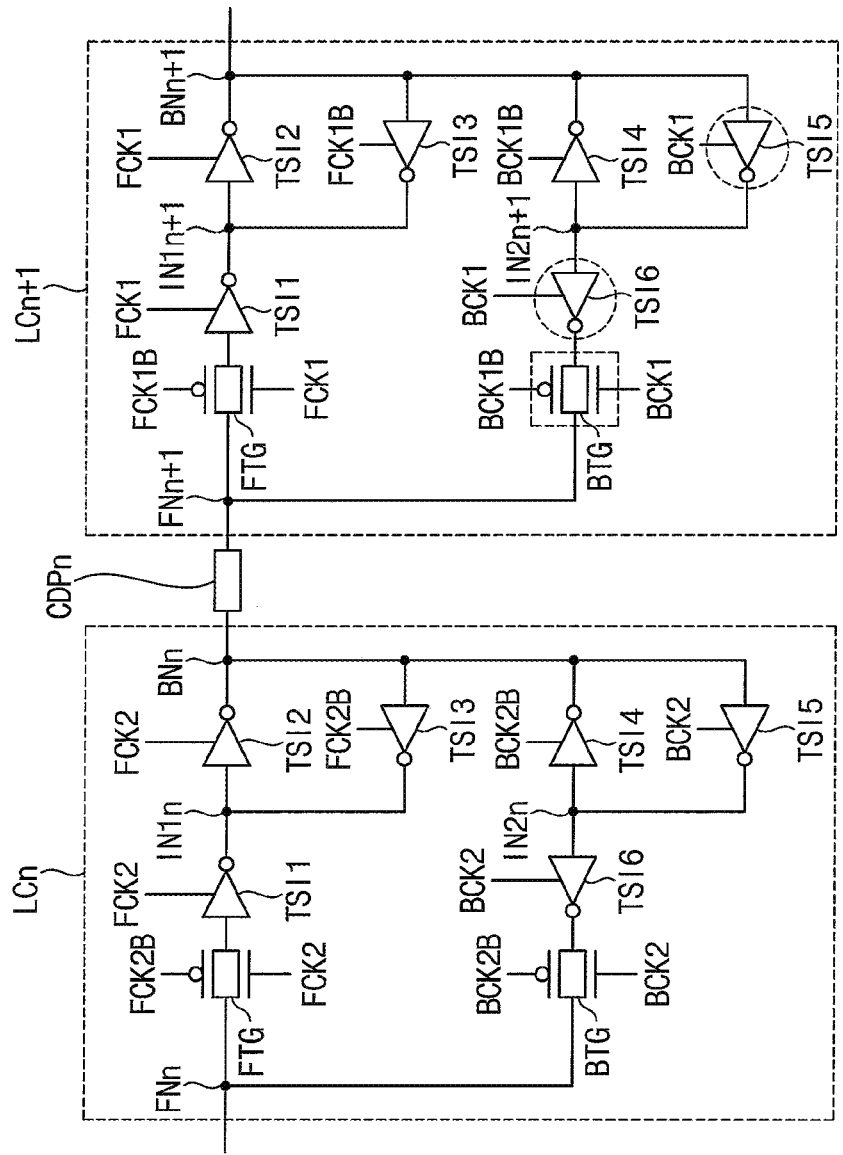

FIGS. 17A and 17B are diagrams for describing operations of the latch circuits of FIG. 15.

FIG. 17A illustrates a case that the forward transfer gate FTG of the even-numbered latch circuit LCn is turned on during the test write operation. For example, the case of FIG. 17A corresponds to the time interval T2~T3 in FIG. 11A. During the time interval T2~T3, only the forward transfer gate FTG of the even-numbered latch circuit LCn is turned on, and the backward transfer gate BTG of the even-numbered latch circuit LCn and the forward and backward transfer gates FTG and BTG of the odd-numbered latch circuit LCn+1 are turned off. In addition, during the time interval T2~T3, only the first and second tri-state inverters TSI1 and TSI2 of the even-numbered latch circuit LCn are turned on, and the third through sixth tri-state inverters TSI3~TSI6 of the even-numbered latch circuit LCn and the first through sixth tri-state inverters TSI1~TSI6 of the odd-numbered latch circuit LCn+1 are turned off.

As a result, during the time interval T2~T3 in FIG. 11A, the bit of the front node FNn of the latch circuit LCn may be transferred to the back node BNn of the latch circuit LCn. As such, the test write operation may be performed by transferring the data bit in the forward direction FDR.

FIG. 17B illustrates a case that the backward transfer gate BTG of the odd-numbered latch circuit LCn+1 is turned on during the test read operation. In other words, the case of FIG. 17B corresponds to the time interval T1~T2 in FIG. 11B. During the time interval T1~T2, only the backward transfer gate BTG of the odd-numbered latch circuit LCn+1 is turned on, and the forward transfer gate FTG of the odd-numbered latch circuit LCn+1 and the forward and backward transfer gates FTG and BTG of the even-numbered latch circuit LCn are turned off. In addition, during the time interval T1~T2, only the fifth and sixth tri-state inverters TSI5 and TSI6 of the odd-numbered latch circuit LCn+1 are turned on, and the first through fourth tri-state inverters TSI1~TSI4 of the odd-numbered latch circuit LCn+1 and the first through sixth tri-state inverters TSI1~TSI6 of the even-numbered latch circuit LCn are turned off.

As a result, during the time interval T1~T2 in FIG. 11B, the bit of the back node BNn+1 of the latch circuit LCn+1 may be transferred to the front node FNn+1 of the latch circuit LCn+1. As such, the test read operation may be performed by transferring the data bit in the backward direction BDR.

Figure 18:
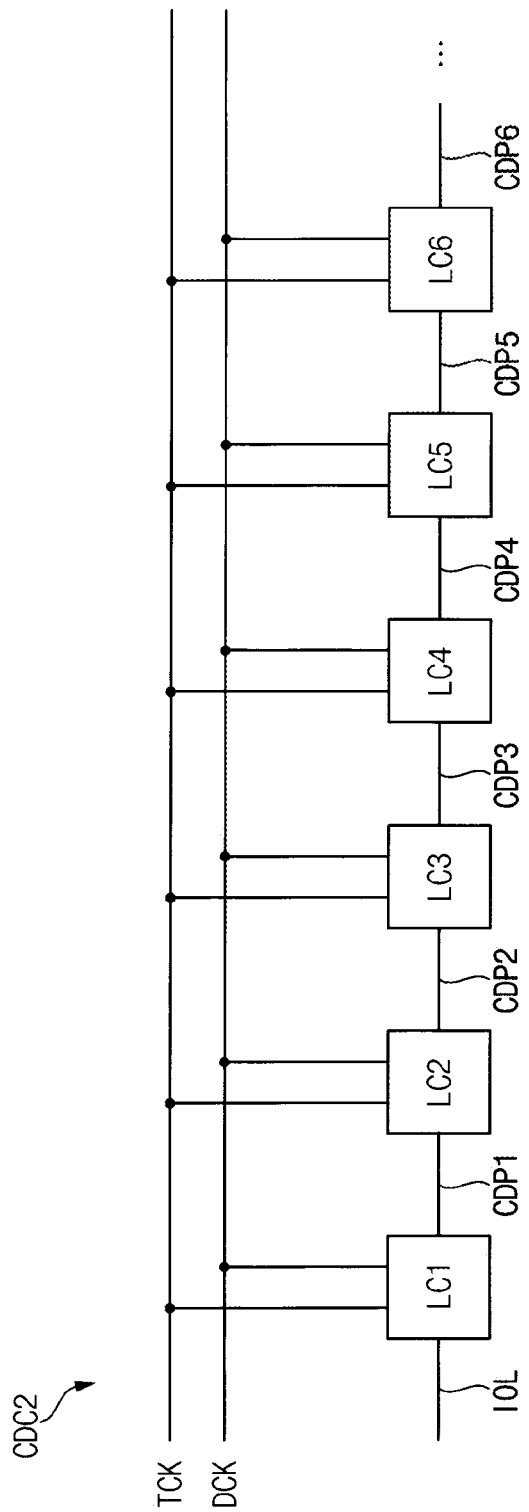
FIG. 18 is a diagram illustrating a defect detection circuit according to some example embodiments.

FIG. 18 is a diagram illustrating a defect detection circuit according to some example embodiments.

Referring to FIG. 18, a defect detection circuit CDC2 may include a plurality of latch circuits LC1~LC6 and a plurality of defect detection conduction paths CDP1~CDP6 such that each defect detection conduction path connects the two adjacent latch circuits. As described above with reference to FIG. 1, the defect detection circuit CDC1 may be disposed in the peripheral region PREG of the semiconductor die SD to form an open conduction loop.

The test control circuit TCC in FIG. 1 may perform the test write operation by sequentially transferring the bits of the input data pattern DPI in the forward direction FDR of the open conduction loop to store the bits of the input data pattern DPI in the plurality of latch circuits LC1~LC6 and the test read operation by transferring bits stored in the plurality of latch circuits LC1~LC6 in the backward direction BDR of the open conduction loop to read out the output data pattern DPO.

The clock generator CGEN in FIG. 1 may generate a transfer clock signal TCK and a direction clock signal DCK applied commonly to the plurality of latch circuits LC1~LC6.

Figure 19:
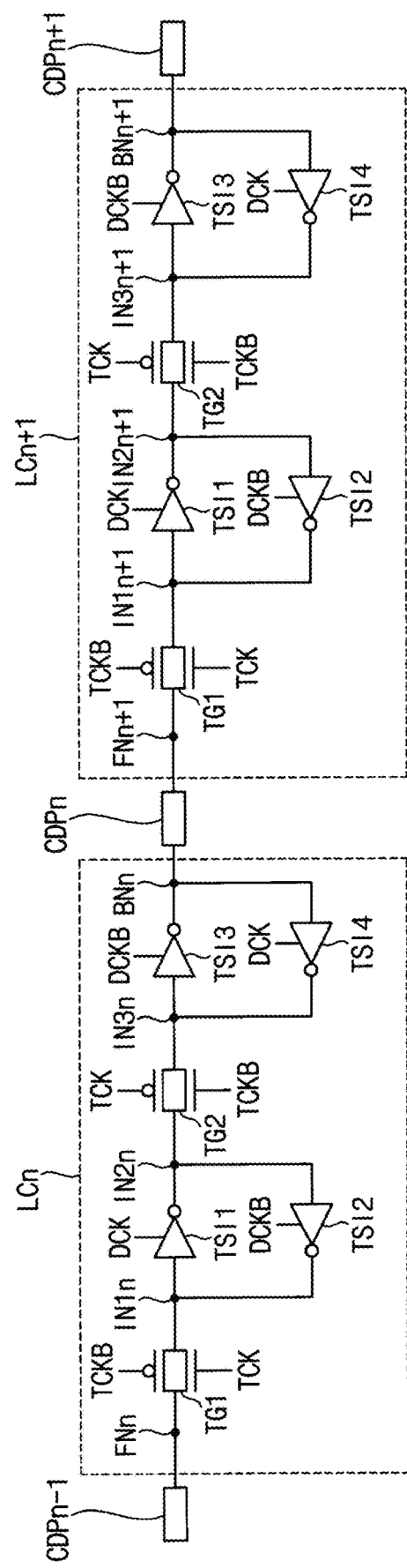
FIG. 19 is a circuit diagram illustrating an example embodiment of latch circuits included in the defect detection circuit of FIG. 18.

FIG. 19 is a circuit diagram illustrating an example embodiment of latch circuits included in the defect detection circuit of FIG. 18.

FIG. 19 illustrates a portion of a defect detection circuit CDC1 corresponding to the two adjacent latch circuits LCn and LCn+1 and the three defect detection conduction paths CDPn−1, CDPn and CDPn+1.

Referring to FIG. 19, each latch circuit LCi (i=n, or n+1) includes a first transfer gate TG1 connected between a front node FNi and a first intermediate node IN1i, a first tri-state inverter TSI1 having an input node connected to the first intermediate node IN1i and an output node connected to a second intermediate node IN2i, a second tri-state inverter TSI2 having an input node connected to the second intermediate node IN2i and an output node connected to the first intermediate node IN1i, a second transfer gate TG2 connected between the second intermediate node IN2i and a third intermediate node IN3i, a third tri-state inverter TSI3 having an input node connected to the third intermediate node IN3i and an output node connected to a back node BNi, and a fourth tri-state inverter TSI4 having an input node connected to the back node BNi and an output node connected to the third intermediate node IN3i.

The first transfer gate TG1 may be turned on in response to the transfer clock signal TCK and the second transfer gate TG2 may be turned on in response to an inversion transfer clock signal TCKB that is inverted from the transfer clock signal TCK. The first and fourth tri-state inverters TSI1 and TSI4 may be turned on in response to the direction clock signal DCK and the second and third tri-state inverters TSI2 and TSI3 may be turned on in response to an inversion direction clock signal DCKB.

Figure 20A:
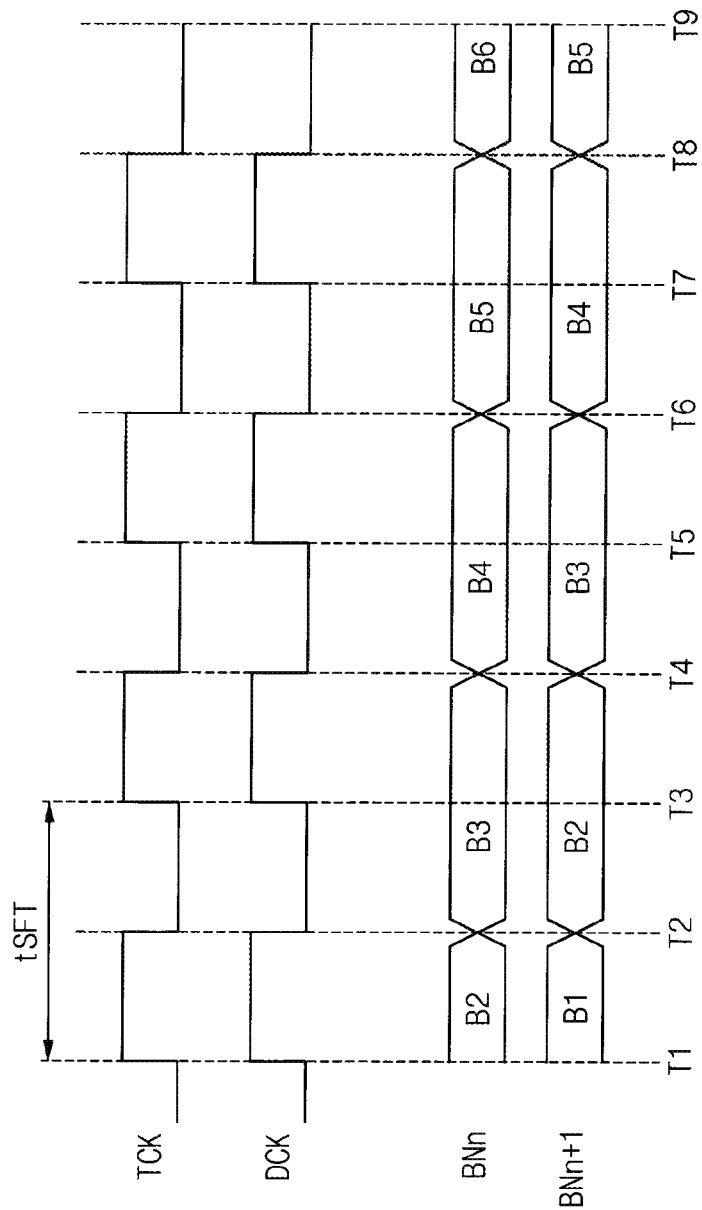
FIGS. 20A and 20B are timing diagrams illustrating operations of the defect detection circuit of FIG. 18.
Figure 20B:
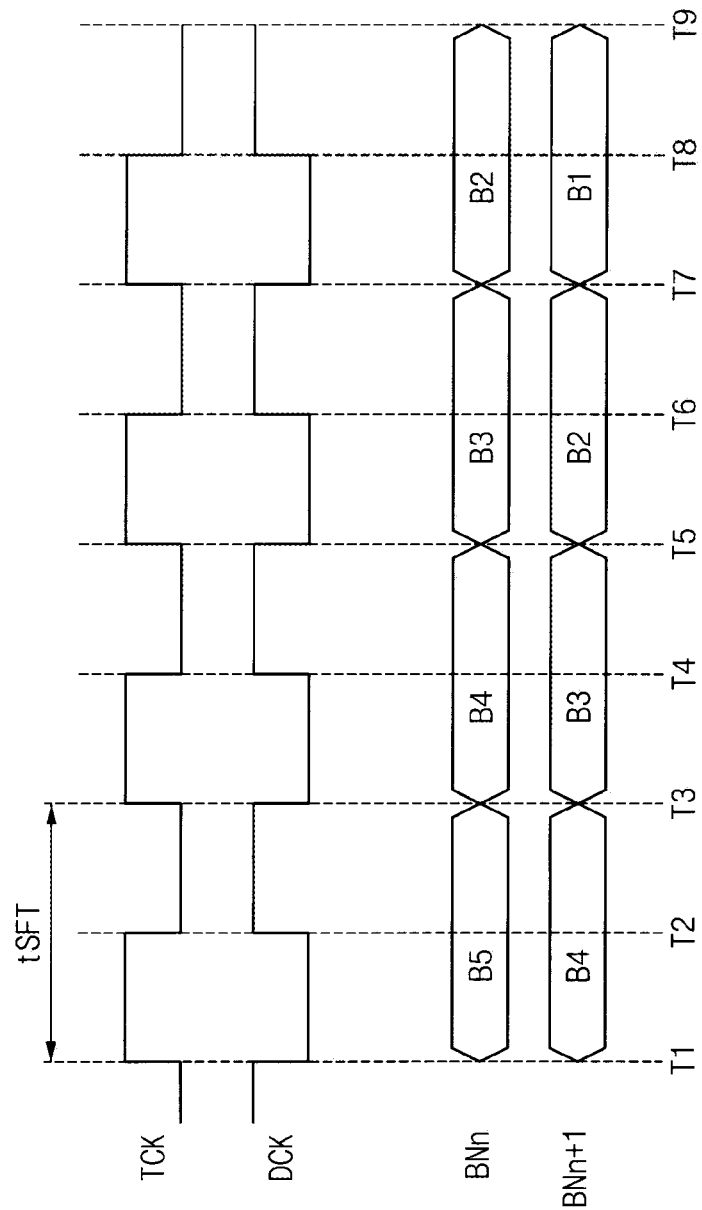

FIGS. 20A and 20B are timing diagrams illustrating operations of the defect detection circuit of FIG. 18.

FIG. 20A illustrates the test write operation of the defect detection circuit CDC2 and FIG. 20B illustrates the test read operation of the defect detection circuit CDC2. FIGS. 20A and 20B illustrate the bits B1~B6 that are latched at the back node BNn of the n-th latch circuit LCn and the back node BNn+1 of the (n+1)-th latch circuit LCn+1 at time points T1~T9. The time points T1~T9 have an interval corresponding a half of the shifting period tSFT.

Referring to FIG. 20A, the clock generator CGEN in the test control circuit TCC in FIG. 1 may activate the transfer clock signal TCK and the direction clock signal DCK to have the same phases during the test write operation. As a result, as illustrated in FIG. 20A, the bits B1~B6 may be transferred sequentially per shifting period tSFT, then from the back node BNn of the n-th latch circuit LCn to the back node BNn+1 of the (n+1)-th latch circuit LCn+1. In other words, the bits B1~B6 of the input data pattern DPI may be transferred sequentially in the forward direction FDR of the open conduction loop during the test write operation.

Referring to FIG. 20B, the clock generator CGEN may activate the transfer clock signal TCK and the direction clock signal DCK to have opposite phases during the test read operation. As a result, as illustrated in FIG. 20B, the bits B1~B6 may be transferred sequentially per shifting period tSFT, from the back node BNn+1 of the (n+1)-th latch circuit LCn+1 to the back node BNn of the n-th latch circuit LCn. In other words, the bits B1~B6 stored in the latch circuits may be transferred sequentially in the backward direction BDR of the open conduction loop and may be read out as the output data pattern DPO during the test read operation.

FIGS. 21A through 21D are diagrams for describing operations of the latch circuits of FIG. 19.

Figure 21A:
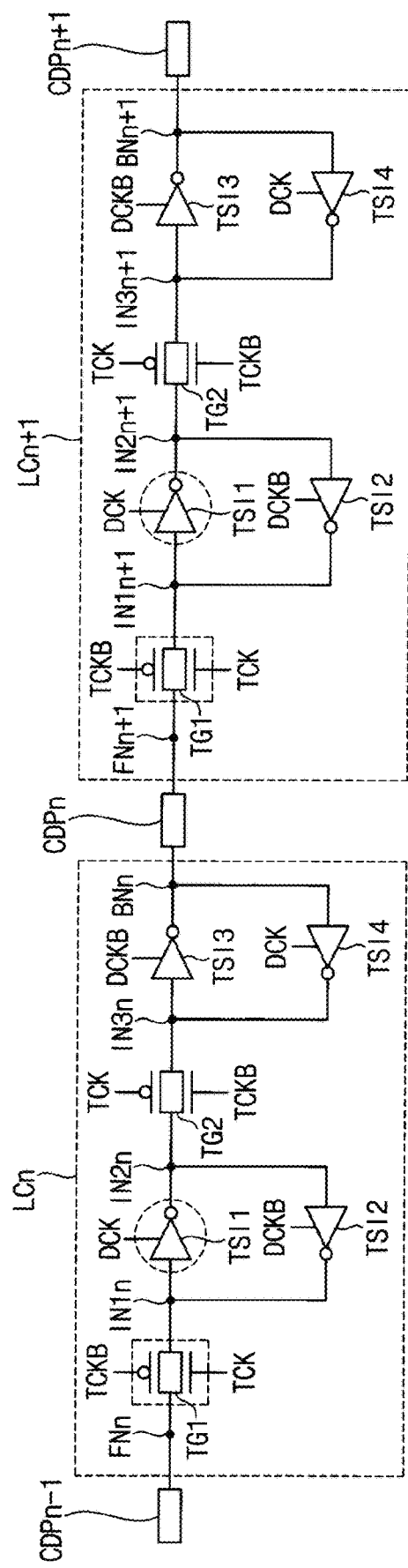
FIGS. 21A through 21D are diagrams for describing operations of the latch circuits of FIG. 19.

FIG. 21A illustrates a case that the first transfer gate TG1 of each latch circuits LCi (i=n or n+1) is turned on during the test write operation. In other words, the case of FIG. 21A corresponds to the time interval T1~T2 in FIG. 20A. During the time interval T1~T2, the first transfer gate TG1 is turned on, the first tri-state inverters TSI1 is enabled, and thus the bit of the front node FNi is transferred to the second intermediate node IN2i.

Figure 21B:
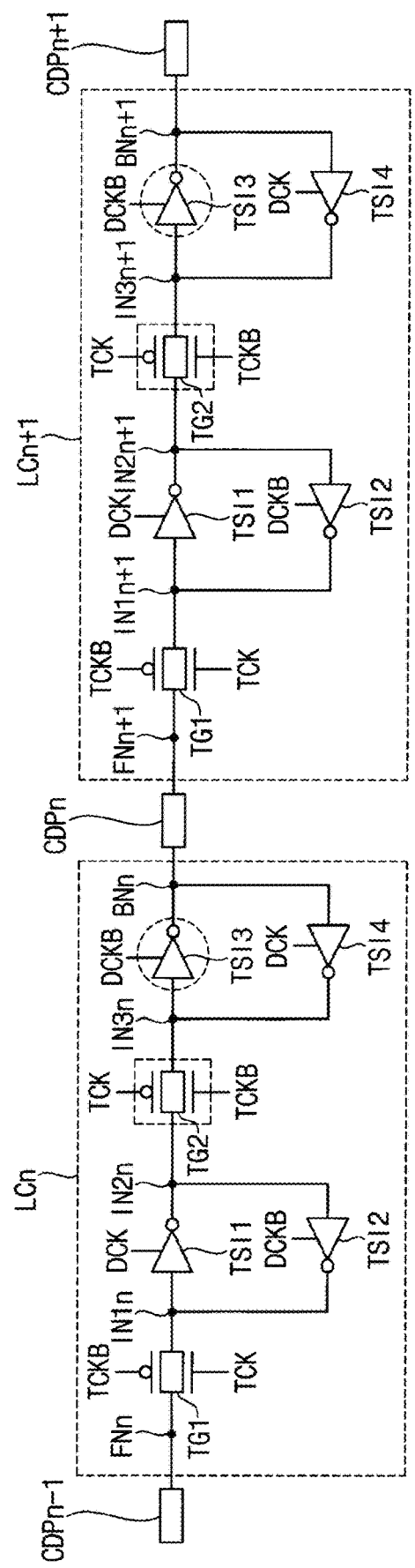

FIG. 21B illustrates a case that the second transfer gate TG2 of each latch circuits LCi (i=n or n+1) is turned on during the test write operation. In other words, the case of FIG. 21B corresponds to the time interval T2~T3 in FIG. 20A. During the time interval T2~T3, the second transfer gate TG2 is turned on, the third tri-state inverters TSI3 is enabled, and thus the bit of the second intermediate node IN2i is transferred to the back node BNi.

As such, the data bit may be transferred per shifting period tSFT, from the front node FNi to the back node BNi, that is, in the forward direction FDR during the test write operation.

Figure 21C:
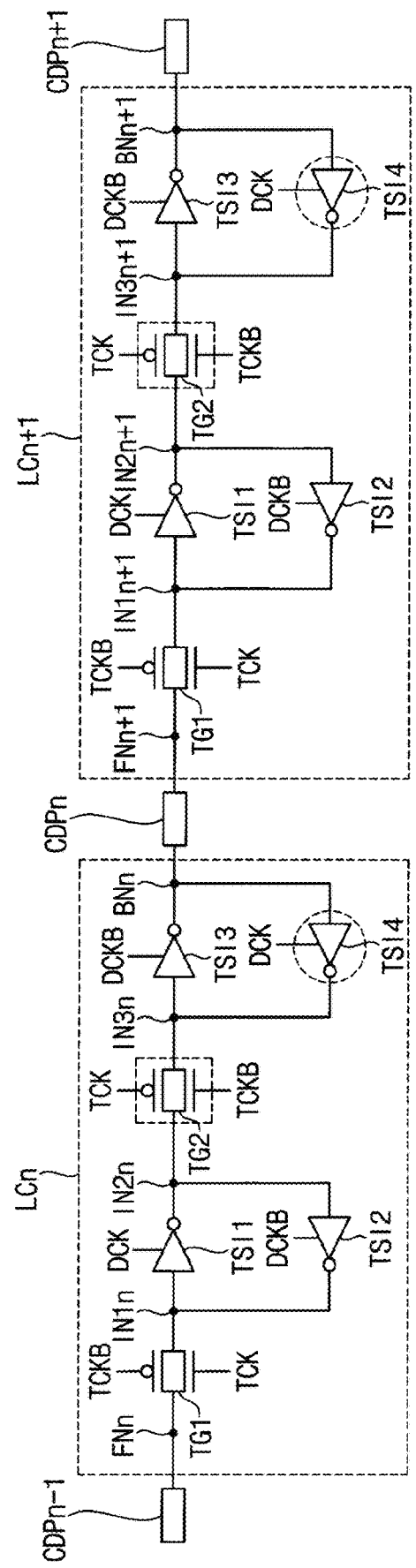

FIG. 21C illustrates a case that the second transfer gate TG2 of each latch circuits LCi (i=n or n+1) is turned on during the test read operation. In other words, the case of FIG. 21C corresponds to the time interval T2~T3 in FIG. 20B. During the time interval T2~T3, the second transfer gate TG2 is turned on, the fourth tri-state inverters TSI4 is enabled, and thus the bit of the back node BNi is transferred to the second intermediate node IN2i.

Figure 21D:
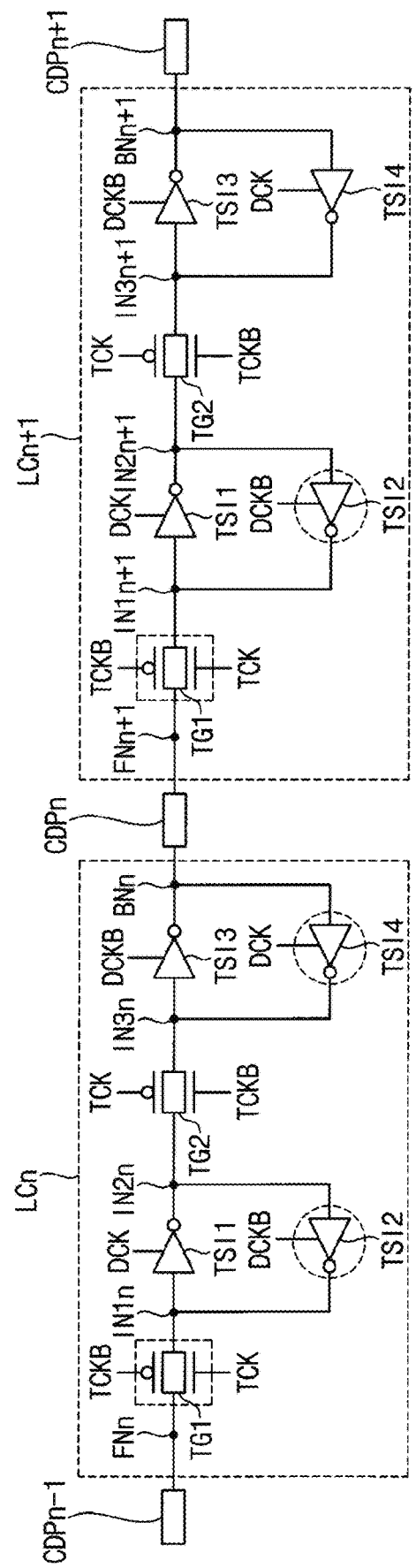

FIG. 21D illustrates a case that the first transfer gate TG1 of each latch circuits LCi (i=n or n+1) is turned on during the test read operation. In other words, the case of FIG. 21D corresponds to the time interval T3~T4 in FIG. 20B. During the time interval T3~T4, the first transfer gate TG1 is turned on, the second tri-state inverters TSI2 is enabled, and thus the bit of the second intermediate node IN2i is transferred to the front node FNi.

As such, the data bit may be transferred per shifting period tSFT, from the back node BNi to the front node FNi, that is, in the backward direction BDR during the test read operation.

Figure 22:
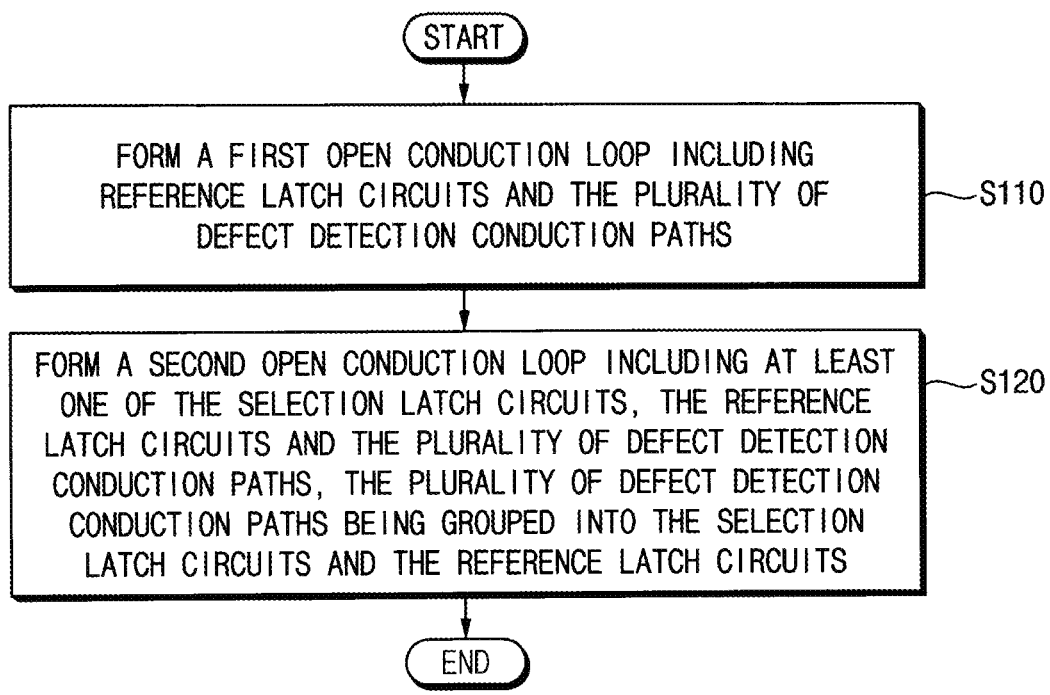
FIG. 22 is a flow chart illustrating a method of detecting defects in a semiconductor device according to some example embodiments.

FIG. 22 is a flow chart illustrating a method of detecting defects in a semiconductor device according to some example embodiments.

Referring to FIG. 22, a first open conduction loop including reference latch circuits and the plurality of defect detection conduction paths may be formed (S110). In addition, a second open conduction loop including at least one of the selection latch circuits, the reference latch circuits and the plurality of defect detection conduction paths may be formed (S120). The plurality of defect detection conduction paths may be grouped into the selection latch circuits and the reference latch circuits.

The first open conduction loop and the second open conduction loop may be formed selectively using a path selector as will be described below with reference to FIGS. 23 and 24.

Whether a defect is present/has occurred and a defect path range of the defect detection conduction paths including the defect may be determined by performing the test write operation and the test read operation with respect to the first open conduction loop. When it is determined that the defect is present/has occurred with respect to the first open conduction loop, a defect detection conduction path including the defect may be determined among the plurality of defect detection conduction paths by performing the test write operation and the test read operation with respect to the second open conduction loop.

Figure 23:
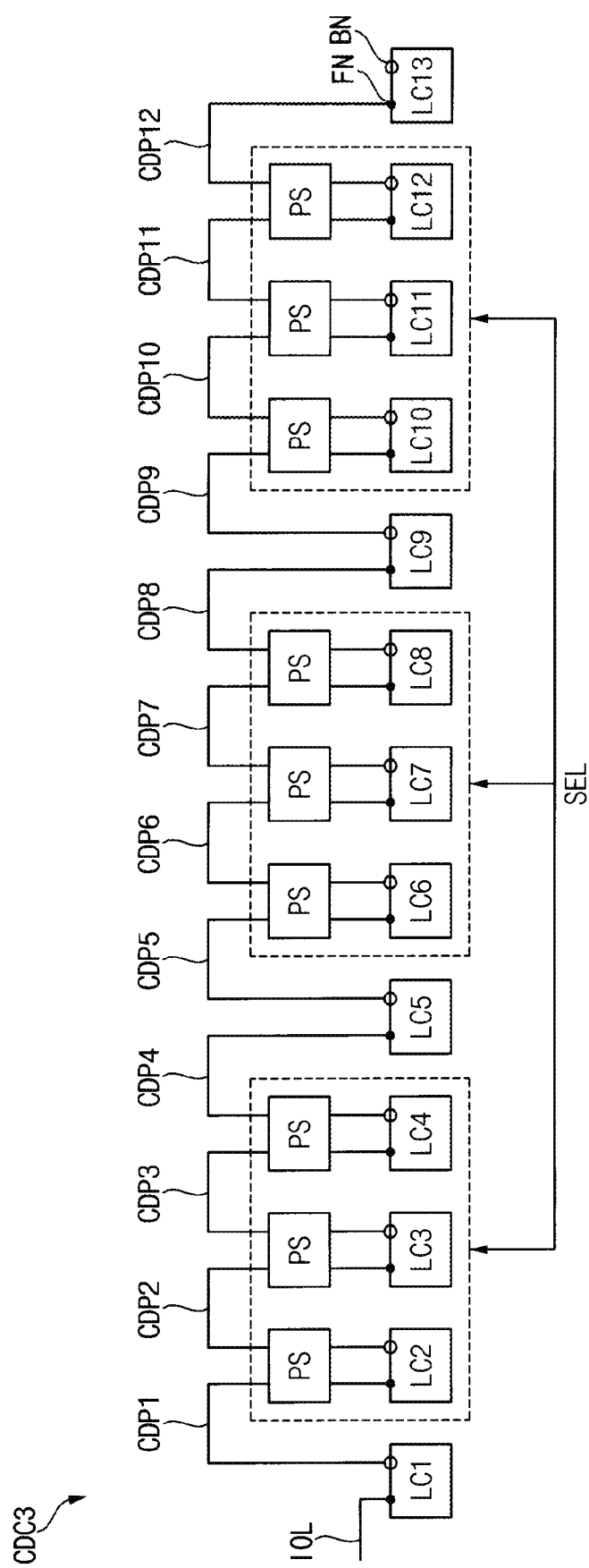
FIG. 23 is a diagram illustrating a defect detection circuit according to some example embodiments.
Figure 24:
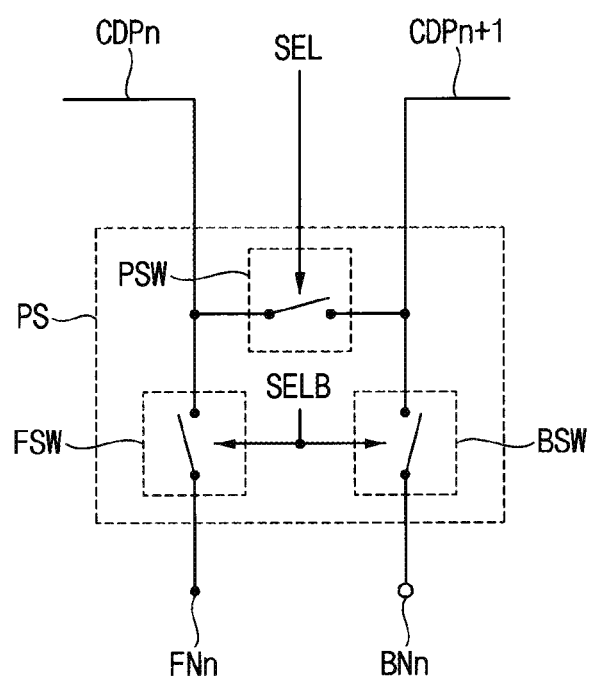
FIG. 24 is a diagram illustrating an example embodiment of a path selector included in the defect detection circuit of FIG. 23.

FIG. 23 is a diagram illustrating a defect detection circuit according to some example embodiments, and FIG. 24 is a diagram illustrating an example embodiment of a path selector included in the defect detection circuit of FIG. 23.

Referring to FIG. 23, a defect detection circuit CDC3 may include a plurality of latch circuits LC1~LC13 and a plurality of defect detection conduction paths CDP1~CDP12 such that each defect detection conduction path connects the two adjacent latch circuits. As described above with reference to FIG. 1, the defect detection circuit CDC3 may be disposed in the peripheral region PREG of the semiconductor die SD to form an open conduction loop. In FIG. 23, the dark circuit indicates the front nodes FN of each latch circuit and the white circuit indicates the back node BN of each latch circuit.

The defect detection circuit CDC3 may further include a plurality of path selectors PS configured to selectively include the selection latch circuits LC2~LC4, LC6~LC8 and LC10~LC12 in the open conduction loop except the reference latch circuits LC1, LC5, LC9 and LC13.

Referring to FIG. 24, the path selector PS may include a pass switch PSW, a front switch FSW and a back switch BSW. The pass switch PSW may be turned on in response to activation of a path selection signal SEL and the front and back switches FSW and BSW may be turned on in response to deactivation of the path selection signal SEL. SELB indicates an inversion signal of the path selection signal SEL. The path selection signal SEL may be provided from the test control circuit TCC in FIG. 1 or an external tester.

When the path selection signal SEL is activated, the pass switch PSW is turned on and the front and back switches FSW and BSW are turned off. As a result, the first open conduction loop including the plurality of defect detection conduction paths CDP1~CDP12 and only the reference latch circuits LC1, LC5, LC9 and LC13 except the selection latch circuits LC2~LC4, LC6~LC8 and LC10~LC12 may be formed by electrically disconnecting each selection latch circuit of the selection latch circuits LC2~LC4, LC6~LC8 and LC10~LC12 from two adjacent defect detection conduction paths CDPn and CDPn+1 and directly electrically connecting the two defect detection conduction paths CDPn and CDPn+1.

When the path selection signal SEL is deactivated, the pass switch PSW is turned off and the front and back switches FSW and BSW are turned on. As a result, the second open conduction loop including the plurality of defect detection conduction paths CDP1~CDP12, the selection latch circuits LC2~LC4, LC6~LC8 and LC10~LC12, and the reference latch circuits LC1, LC5, LC9 and LC13 may be formed by electrically connecting the selection latch circuits LC2~LC4, LC6~LC8 and LC10~LC12 to the two defect detection conduction paths CDPn and CDPn+1.

Figure 25A:
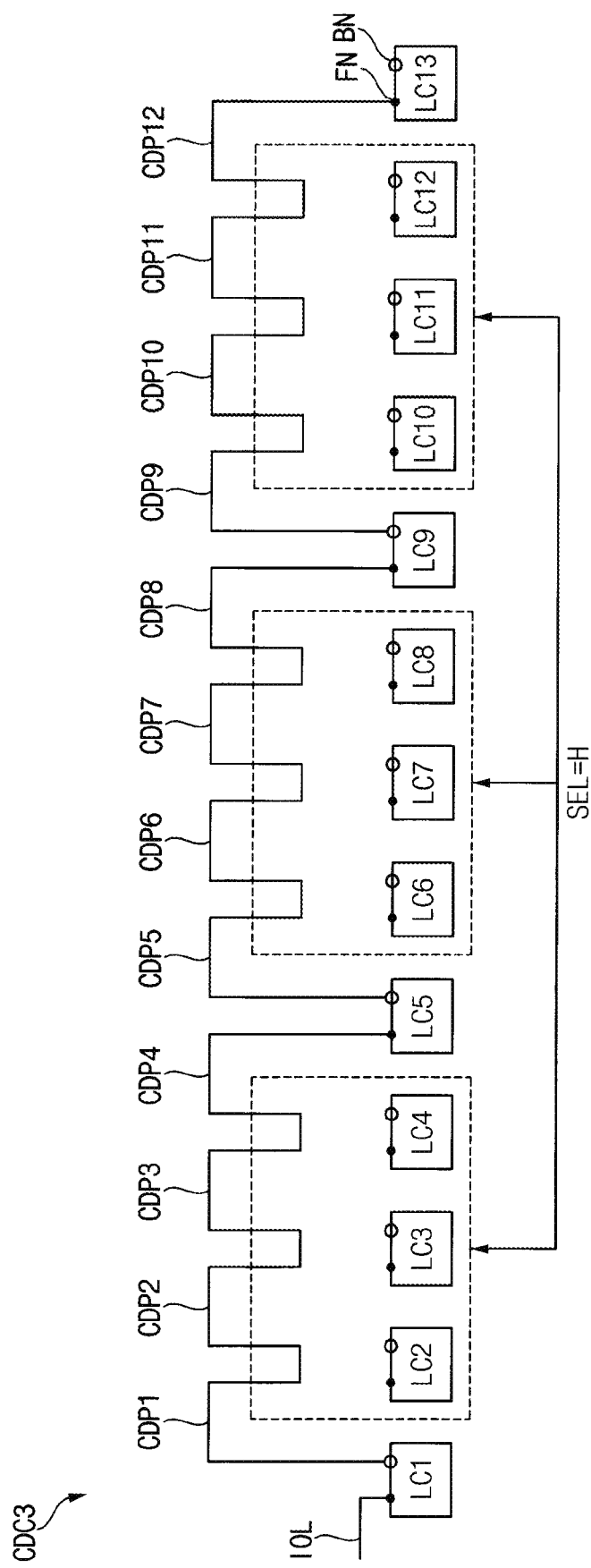
FIGS. 25A and 25B are diagrams for describing test operations of the defect detection circuit of FIG. 23.
Figure 25B:
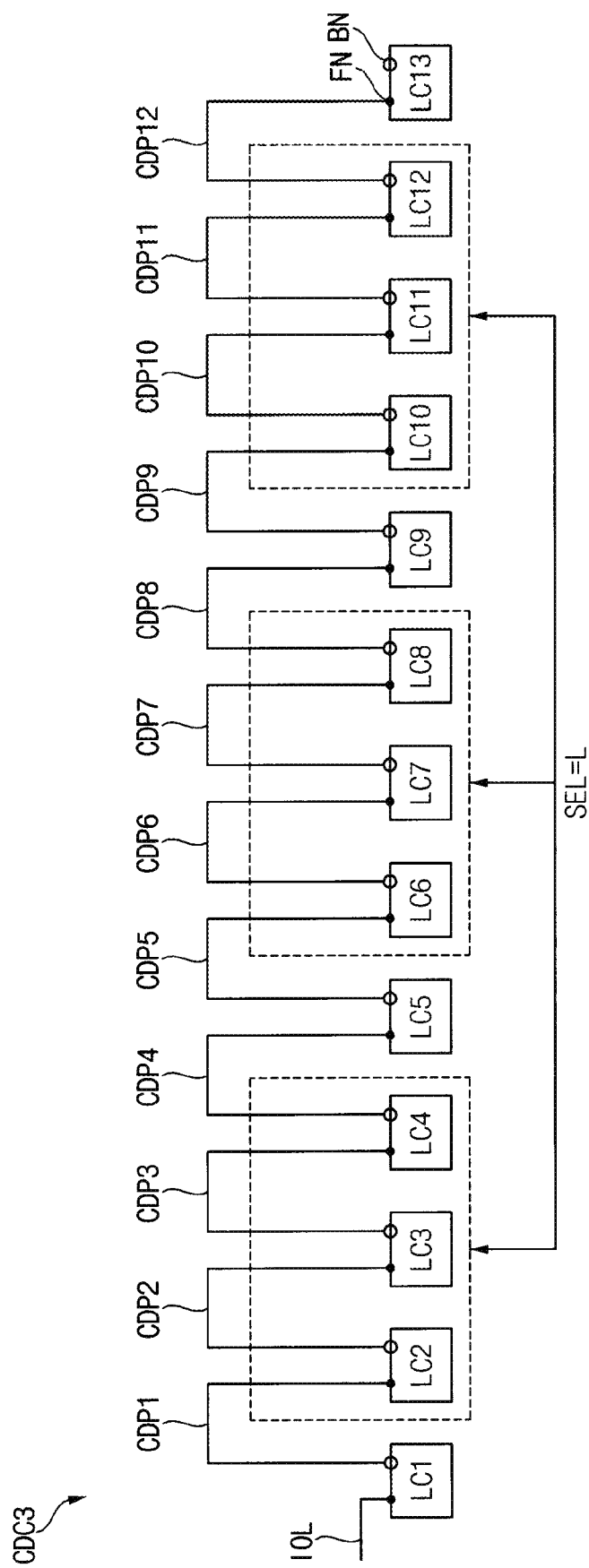

FIGS. 25A and 25B are diagrams for describing test operations of the defect detection circuit of FIG. 23.

FIG. 25A illustrates the first open conduction loop that is formed when the path selection signal SEL is activated, for example, in the logic high level H, and FIG. 25B illustrates the second open conduction loop that is formed when the path selection signal SEL is deactivated, for example, in the logic low level L.

As illustrated in FIG. 23, the path selectors PS corresponding to the selection latch circuits LC2~LC4, LC6~LC8 and LC10~LC12 may operate in response to the same path selection signal SEL. In this case, all of the selection latch circuits LC2~LC4, LC6~LC8 and LC10~LC12 may be included in the second open conduction loop as illustrated in FIG. 25B regardless of the defect path range, where the defect path range may be determined using the first open conduction loop as illustrated in FIG. 25A.

Figure 26:
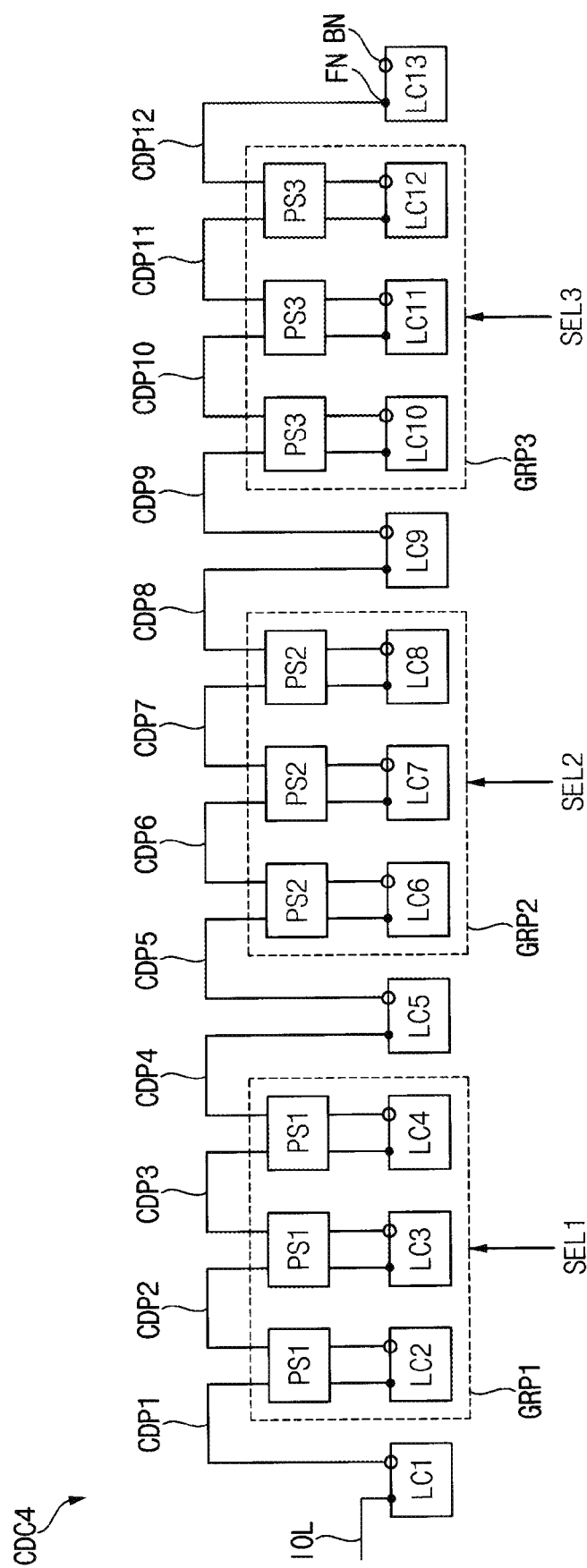
FIG. 26 is a diagram illustrating a defect detection circuit according to some example embodiments.
Figure 27A:
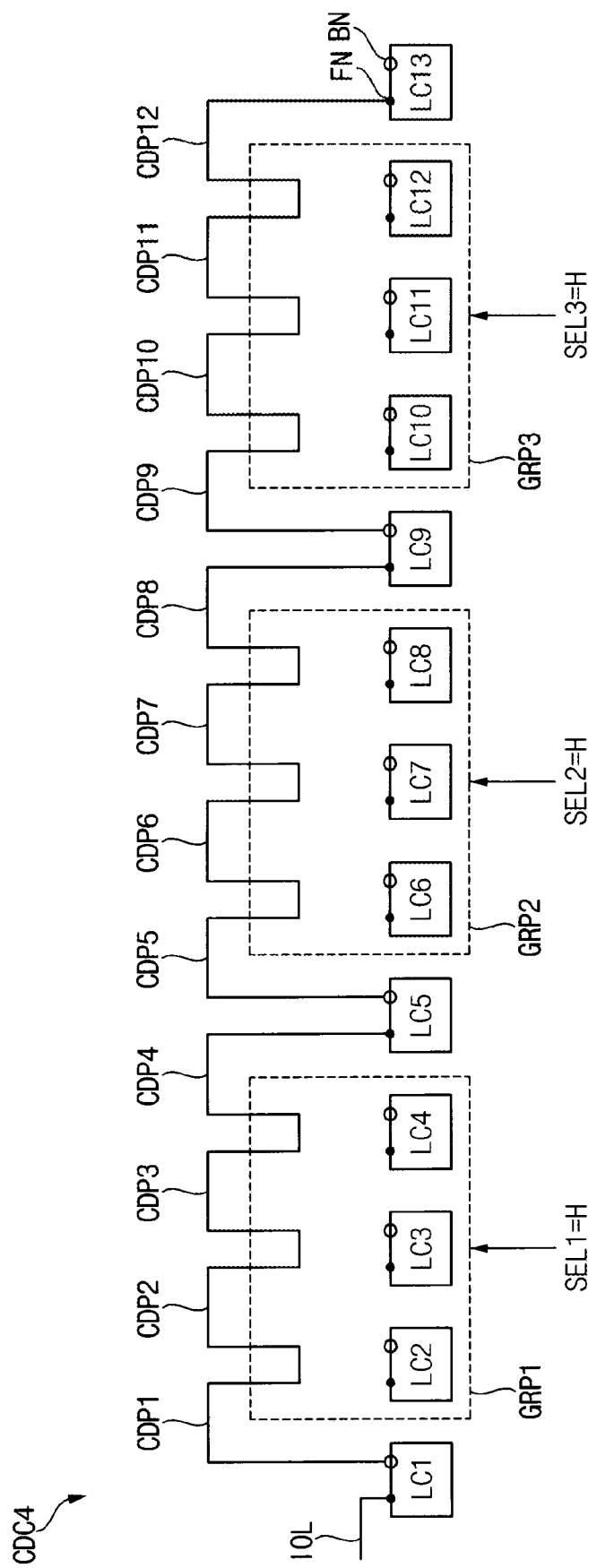
FIGS. 27A and 27B are diagrams for describing test operations of the defect detection circuit of FIG. 26.
Figure 27B:
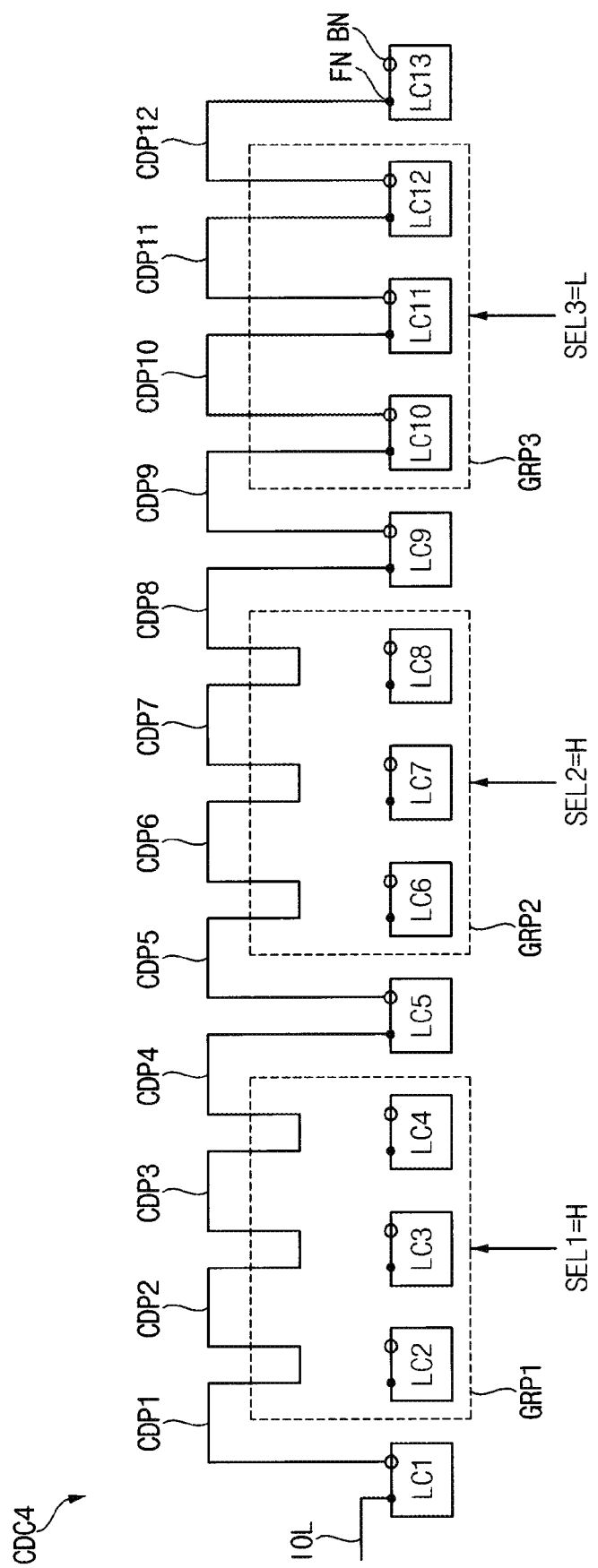

FIG. 26 is a diagram illustrating a defect detection circuit according to some example embodiments, and FIGS. 27A and 27B are diagrams for describing test operations of the defect detection circuit of FIG. 26. A defect detection circuit CDC4 of FIG. 26 is substantially the same as the defect detection circuit CDC3 of FIG. 23, and the repeated descriptions are omitted.

Referring to FIG. 26, the selection latch circuits LC2~LC4, LC6~LC8 and LC10~LC12 may be divided into a first group GRP1 including the selection latch circuits LC2~LC4 corresponding to first path selectors PS1 in response to a first path selection signal SEL1, a second group GRP2 including the selection latch circuits LC6~LC8 corresponding to second path selectors PS2 in response to a second path selection signal SEL2, and a third group GRP3 including the selection latch circuits LC10~LC12 corresponding to third path selectors PS3 in response to a third path selection signal SEL3.

FIG. 27A illustrates the first open conduction loop that is formed when the first through third path selection signals SEL1~SEL3 are activated, for example, in the logic high level H, and FIG. 27B illustrates the second open conduction loop that is formed when the first and second path selection signals SEL1 and SEL2 are activated and only the third path selection signal SEL3 is deactivated, for example, in the logic low level L.

For example, using the first open conduction loop of FIG. 27A, the third group including the selection latch circuits LC10~LC12 may be determined as the defect path range including the defect. In this case, the second open conduction loop may be formed as illustrated in FIG. 27B by maintaining the activation of the first and second path selection signals SEL1 and SEL2 and deactivating the third path selection signal SEL3. As a result, only the selection latch circuits LC10~LC12 corresponding to the defect path range may be included in the second open conduction loop.

As described with reference to FIGS. 22 through 27B, through combination of the coarse detection using the first open conduction loop and the fine detection using the second open conduction loop, the location of the defect in addition to the occurrence of the defect may be detected efficiently with reduction of the test time and the power consumption.

Figure 28:
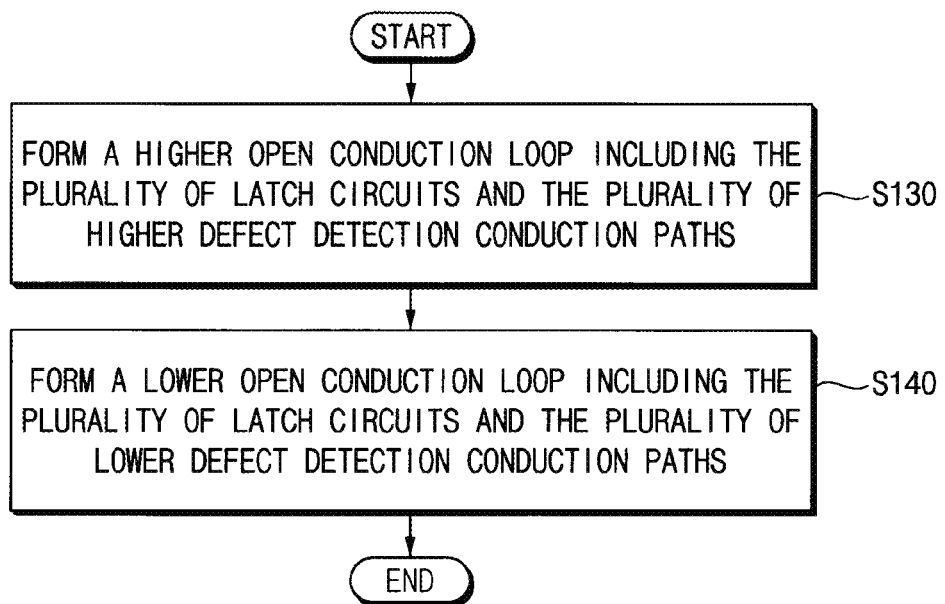
FIG. 28 is a flow chart illustrating a method of detecting defects in a semiconductor device according to some example embodiments.

FIG. 28 is a flow chart illustrating a method of detecting defects in a semiconductor device according to some example embodiments.

Referring to FIG. 28, a higher open conduction loop including a plurality of latch circuits and a plurality of higher defect detection conduction paths may be formed (S130). In addition, a lower open conduction loop including the plurality of latch circuits and a plurality of lower defect detection conduction paths may be formed (S140). The plurality of defect detection conduction paths as described above may include the plurality of higher defect detection conduction paths and the plurality of lower defect detection conduction paths as will be described below with reference to FIGS. 29 and 30.

The higher open conduction loop and the lower open conduction loop may be formed selectively using a path selector as will be described below with reference to FIGS. 23 and 24.

Whether a defect is present/has occurred and the higher defect detection conduction path including the defect may be determined by performing the test write operation and the test read operation with respect to the higher open conduction loop. In addition, whether a defect is present/has occurred and the lower defect detection conduction path including the defect may be determined by performing the test write operation and the test read operation with respect to the lower open conduction loop.

Figure 29:
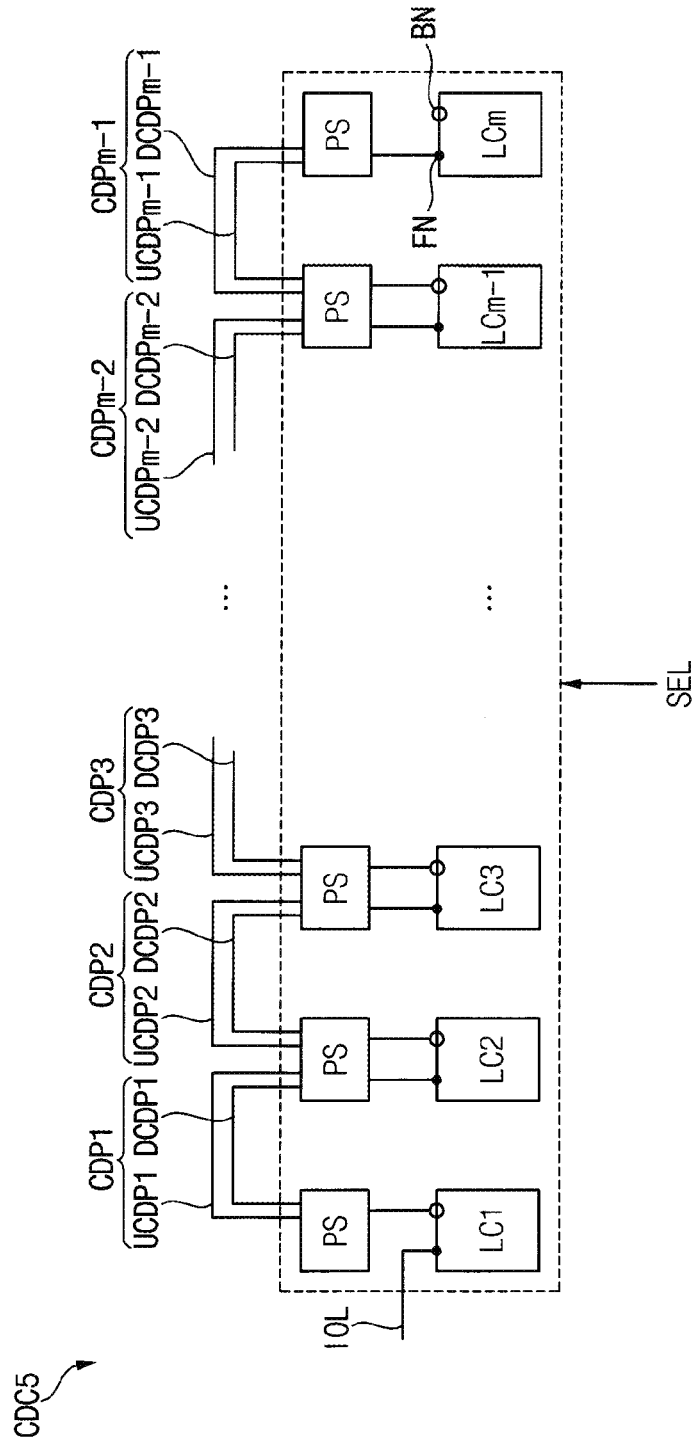
FIG. 29 is a diagram illustrating a defect detection circuit according to some example embodiments.
Figure 30:
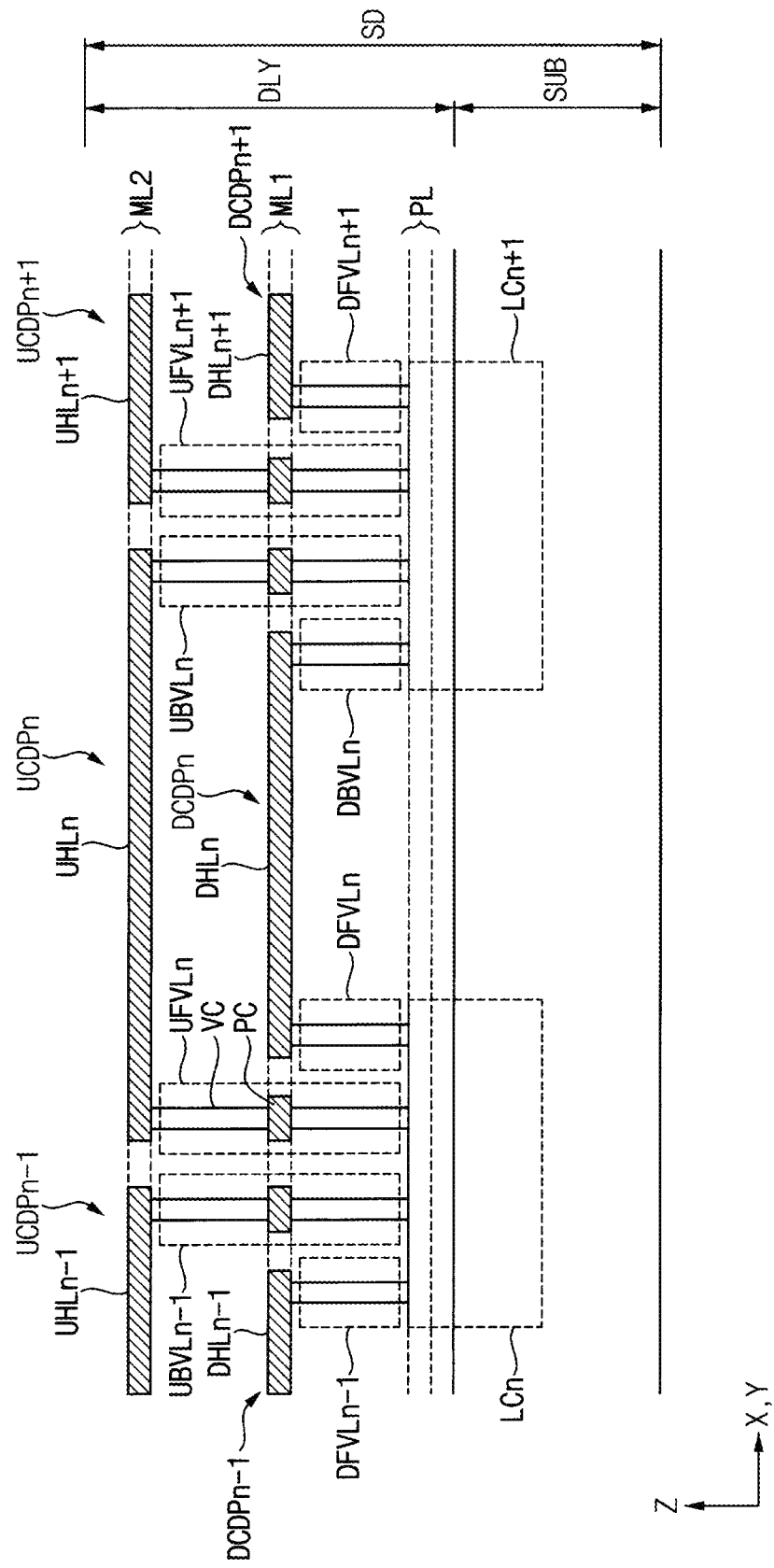
FIG. 30 is a cross-sectional diagram illustrating a vertical structure of the defect detection circuit of FIG. 29.

FIG. 29 is a diagram illustrating a defect detection circuit according to some example embodiments, and FIG. 30 is a cross-sectional diagram illustrating a vertical structure of the defect detection circuit of FIG. 29.

Referring to FIGS. 29 and 30, a defect detection circuit CDC5 may include a plurality of latch circuits LC1~LCm and a plurality of defect detection conduction paths CDP1~CDPm−1 such that each defect detection conduction path connects the two adjacent latch circuits. The defect detection circuit CDC5 may further include a plurality of path selectors PS. As described above with reference to FIG. 1, the defect detection circuit CDC5 may be disposed in the peripheral region PREG of the semiconductor die SD to form an open conduction loop. In FIG. 29, the dark circuit indicates the front nodes FN of each latch circuit and the white circuit indicates the back node BN of each latch circuit.

The plurality of defect detection conduction paths CDP1~CDPm−1 may include a plurality of higher defect detection conduction paths UCDP1~UCDPm−1 and a plurality of lower defect detection conduction paths DCDP1~DCDPm−1. Each of the higher defect detection conduction paths UCDP1~UCDPm−1 may include a horizontal line disposed in a higher metal layer ML2 and each of the lower defect detection conduction paths DCDP1~DCDPm−1 may include a horizontal line disposed in a lower metal layer ML1. Lower metal layer ML1 may be closer to the substrate of the semiconductor device than higher metal layer ML2.

FIG. 30 illustrates a portion of the defect detection conduction path CDP5 corresponding to the two adjacent latch circuits LCn~LCn+1. The descriptions repeated with FIG. 2 may be omitted.

For example, as illustrated in FIG. 30, the higher defect detection conduction path UCDPn of the n-th defect detection conduction path CDPn may include a horizontal line UHLn disposed in a higher conduction layer ML2, a front vertical line UFVLn connecting the horizontal line UHLn to the front latch circuit LCn of the two adjacent latch circuits LCn and LCn+1, and a back vertical line UBVLn connecting the horizontal line UHLn to the back latch circuit LCn+1 of the two adjacent latch circuits LCn and LCn+1. In addition, the lower defect detection conduction path DCDPn of the n-th defect detection conduction path CDPn may include a horizontal line DHLn disposed in a lower conduction layer ML1, a front vertical line DFVLn connecting the horizontal line DHLn to the front latch circuit LCn of the two adjacent latch circuits LCn and LCn+1, and the back vertical line DBVLn connecting the horizontal line DHLn to the back latch circuit LCn+1 of the two adjacent latch circuits LCn and LCn+1.

Figure 31:
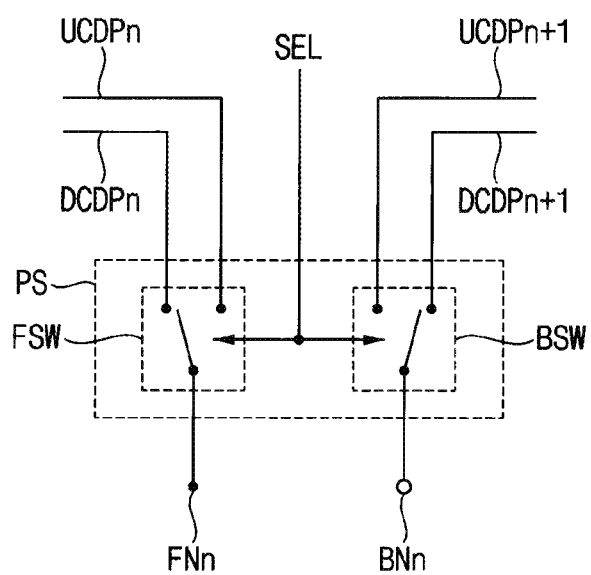
FIG. 31 is a diagram illustrating some example embodiments of a path selector included in the defect detection circuit of FIG. 29.

FIG. 31 is a diagram illustrating some example embodiments of a path selector included in the defect detection circuit of FIG. 29.

Referring to FIG. 31, the path selector PS may include a front switch FSW and a back switch BSW. The front and back switches FSW and BSW may electrically connect the two adjacent higher defect detection conduction paths UCDPn and UCDPn+1 to the front node FNn and the back node BNn of the corresponding latch circuit LCn in response to activation of a path selection signal SEL, to form the higher open conduction loop including the plurality of latch circuits LC1~LCm and the plurality of higher defect detection conduction paths UCDP1~UCDP m−1. In contrast, The front and back switches FSW and BSW may electrically connect the two adjacent lower defect detection conduction paths DCDPn and DCDPn+1 to the front node FNn and the back node BNn of the corresponding latch circuit LCn in response to deactivation of the path selection signal SEL, to form the lower open conduction loop including the plurality of latch circuits LC1~LCm and the plurality of lower defect detection conduction paths DCDP1~DCDP m−1.

Figure 32A:
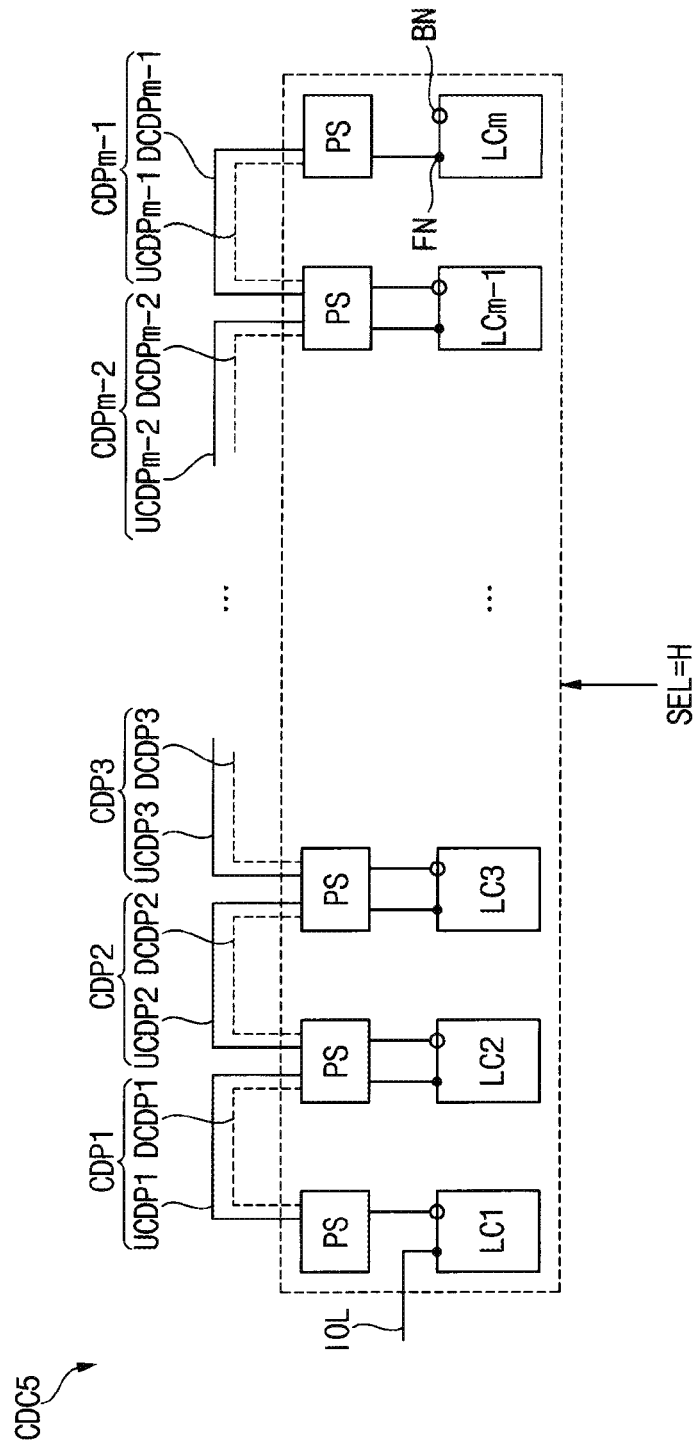
FIGS. 32A and 32B are diagrams for describing test operations of the defect detection circuit of FIG. 29.
Figure 32B:
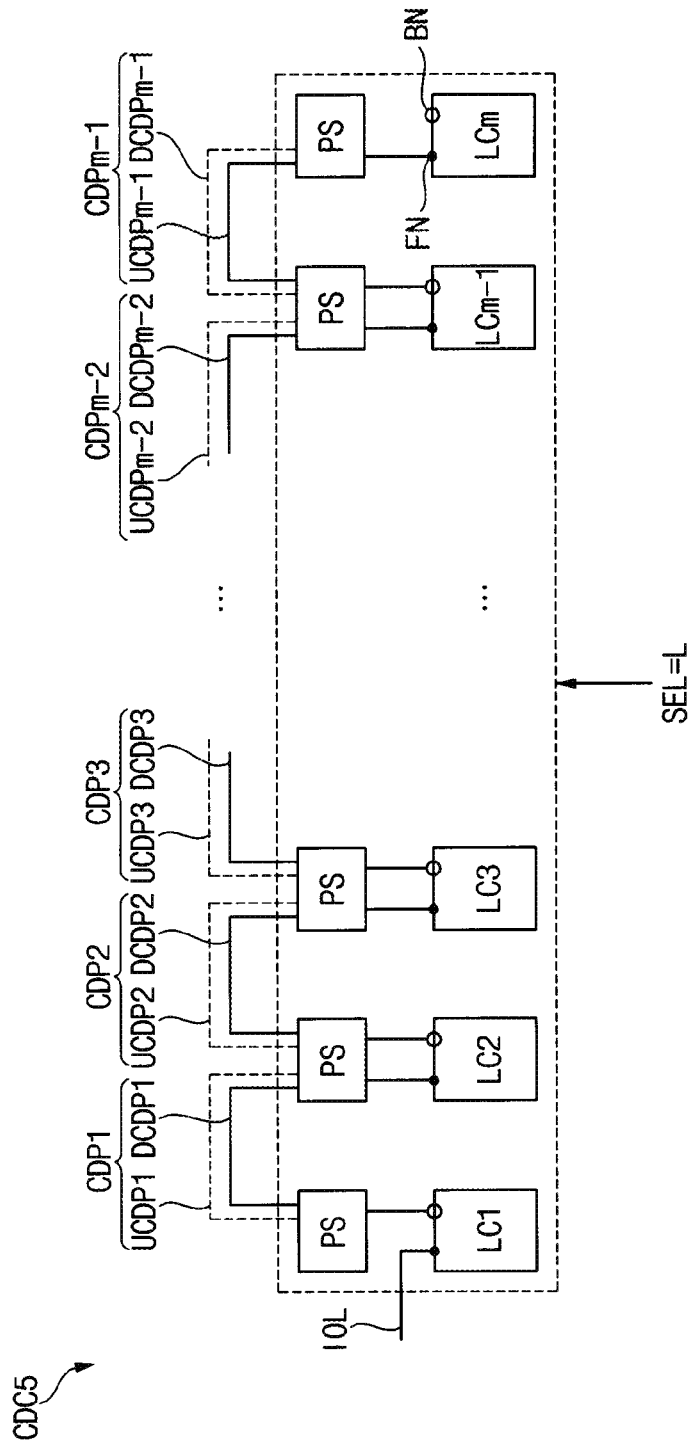

FIGS. 32A and 32B are diagrams for describing test operations of the defect detection circuit of FIG. 29.

FIG. 32A illustrates the higher open conduction loop that is formed when the path selection signal SEL is activated, for example, in the logic high level H, and FIG. 32B illustrates the lower open conduction loop that is formed when the path selection signal SEL is deactivated, for example, in the logic low level L.

The vertical location of the defect in addition to the horizontal location of the defect may be detected by performing the test write operation and the test read operation as described above with respect to each of the higher open conduction loop and the lower open conduction loop.

Figure 33:
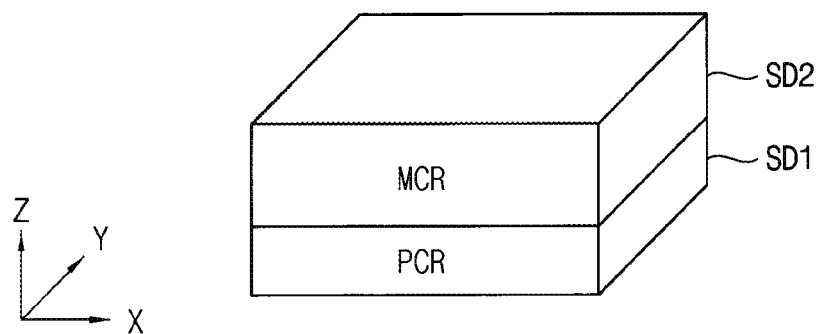
FIG. 33 is a perspective view of a nonvolatile memory device according to some example embodiments.

FIG. 33 is a perspective view of a nonvolatile memory device according to some example embodiments.

Referring to FIG. 33, a nonvolatile memory device 102 may include a peripheral circuit region PCR in which a peripheral circuit is formed and a memory cell region MCR in which a memory cell array is formed.

For example, the nonvolatile memory device 102 may have a stack structure in which a first semiconductor die SD1 and a second semiconductor die SD2 are stacked in the vertical direction Z. The peripheral circuit region PCR may be formed in the first semiconductor die SD1 and the memory cell region MCR may be formed in the second semiconductor die SD2. As such, a size of the nonvolatile memory device 102 may be reduced by adopting a cell over periphery (COP) structure, in which the memory cell array is stacked on the peripheral circuit.

Figure 34:
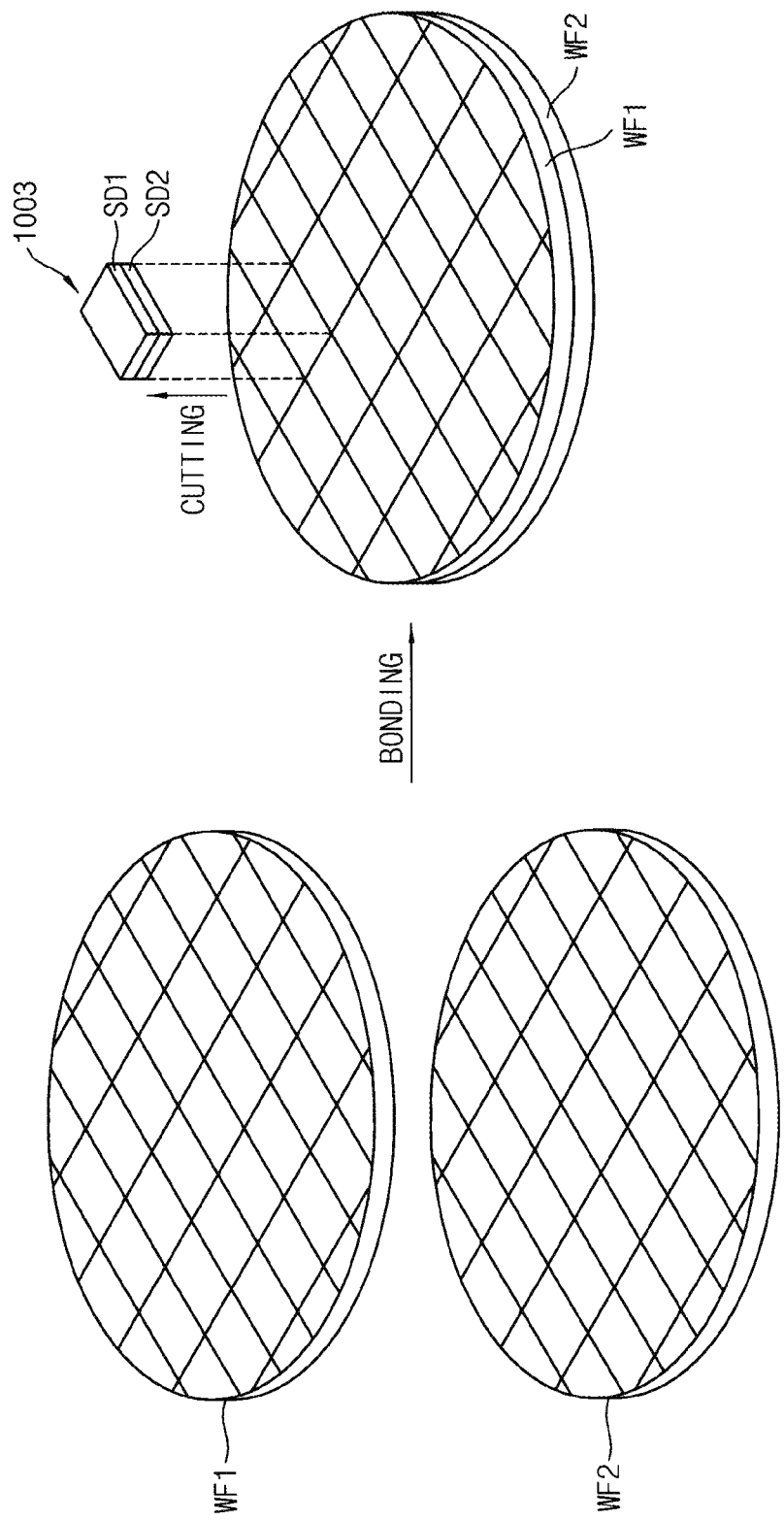
FIG. 34 is a diagram for describing manufacturing/fabrication processes of a stacked semiconductor device according to some example embodiments.

FIG. 34 is a diagram for describing manufacturing processes of a stacked semiconductor device according to some example embodiments.

Referring to FIG. 34, respective integrated circuits may be formed in a first wafer WF1 and a second wafer WF2. The same circuits may be integrated in the first wafer WF1 and the second wafer WF2 or different circuits may be integrated in the first wafer WF1 and the second wafer WF2. After the integrated circuits are formed in the first and second wafers WF1 and WF2, the first wafer WF1 and the second wafer WF2 may be bonded. The bonded wafers WF1 and WF2 are cut and divided into a plurality of chips where each chip corresponds to a semiconductor device 1003 including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to a second semiconductor die SD2.

FIG. 35 is a cross-sectional diagram illustrating a stacked semiconductor device according to some example embodiments.

Referring to FIG. 35, a first semiconductor die SD1 may include a first semiconductor substrate SUB1 and a first dielectric layer DLY1 in which upper structures of the first semiconductor substrate SUB1 are formed, and a second semiconductor die SD2 may include a second semiconductor substrate SUB2 and a second dielectric layer DLY2 in which upper structures of the second semiconductor substrate SUB2 are formed. Each of the first and second dielectric layers DLY1 and DLY2 may include a plurality of conduction layers. For convenience of illustration, FIG. 35 illustrates one polysilicon layer PL in the first dielectric layer DLY1 and one metal layer ML2 in the second dielectric layer DLY2.

A defect detection circuit described above with reference to FIG. 2 may be formed in the stacked structure of FIG. 35. The descriptions repeated with FIG. 2 are omitted for brevity. As illustrated in FIG. 35, the horizontal line HLn of the defect detection conduction path CDPn may be formed in the metal layer ML2 in the second dielectric layer DLY2 and the latch circuits LCn and LCn+1 may be formed in the first semiconductor substrate SUB1. In this case, the front vertical line FVLn and the back vertical line BVLn of the defect detection conduction path CDPn may include vertical contacts VC1 and VC2 and through-silicon vias TSV penetrating the second semiconductor substrate SUB2.

Figure 36:
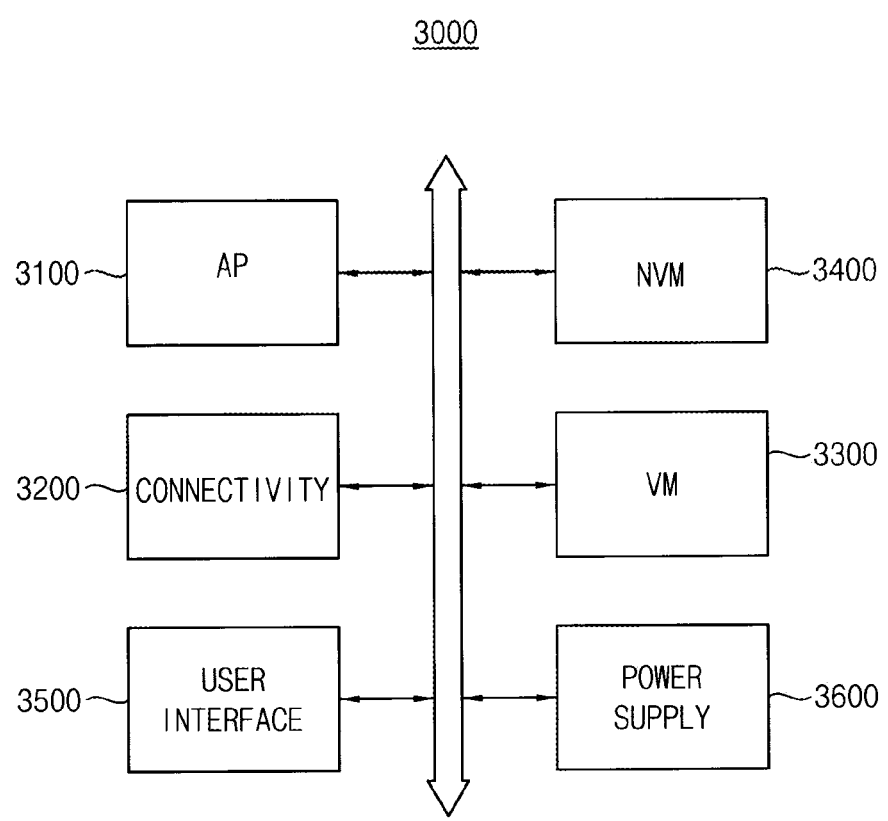
FIG. 36 is a block diagram illustrating a system including a semiconductor device according to some example embodiments.

FIG. 36 is a block diagram illustrating a system including a semiconductor device according to some example embodiments.

Referring to FIG. 36, a system 3000 includes an application processor 3100, a connectivity unit 3200, a volatile memory device VM 3300, a nonvolatile memory device NVM 3400, a user interface 3500, and a power supply 3600 connected via a bus.

The application processor 3100 may be configured to execute applications such as at least one of a web browser, a game application, a video player, etc. The connectivity unit 3200 may perform wired and/or wireless communication with an external device. The volatile memory device 3300 may store data processed by the application processor 3100, and/or may operate as a working memory. For example, the volatile memory device 3300 may be or include a DRAM, such as at least one of a double data rate synchronous dynamic random access memory (DDR SDRAM), low power DDR (LPDDR) SDRAM, graphics DDR (GDDR) SDRAM, Rambus DRAM (RDRAM), etc. The nonvolatile memory device 3400 may store a boot image for booting the system 3000 and other data. The user interface 3500 may include at least one input device, such as a keypad, a touch screen, etc., and at least one output device, such as a speaker, a display device, etc. The power supply 3600 may supply a power supply voltage to the system 3000. The mobile system 3000 may further include at least one of a camera image processor (CIS), and/or a storage device, such as a memory card, a solid state drive (SSD), a hard disk drive (HDD), a compact disc read only memory (CD-ROM), etc.

According to some example embodiments, the volatile memory device 3300 and/or the nonvolatile memory device 3400 may be implemented as a semiconductor device including the defect detection conduction path as described with reference to FIGS. 1 through 35.

As described above, the semiconductor device and the associated method according to some example embodiments may detect crack penetration of various types thoroughly using the defect detection circuit including the plurality of latch circuits and the plurality of defect detection conduction paths. The semiconductor device and the associated method according to some example embodiments may prevent or reduce the likelihood of yield impact of bad and/or defective products with enhanced detectability of the crack.

Some example embodiments may be applied to any electronic devices and systems formed using semiconductor dies. For example, the defect detection circuit according to some example embodiments may be applied to systems such as at least one of a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

Any of the elements disclosed above may include or be implemented in circuitry such as processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of some example embodiments and is not to be construed as limiting thereof. Although a few example embodiments have been described, those of ordinary skill in the art will readily appreciate that many modifications are possible in example embodiments without materially departing from inventive concepts.

What is claimed is:

1. A semiconductor device comprising:
    a semiconductor die including a central region and a peripheral region surrounding the central region;
    a defect detection circuit in the peripheral region to surround a perimeter of the semiconductor die, the defect detection circuit arranged in an open conduction loop and configured to detect a penetratin of a crack occurring during cutting of the semiconductor die, the defect detection circuit comprising a plurality of latch circuits and a plurality of defect detection conduction paths, each defect detection conduction path of the plurality of defect detection conduction paths connecting two adjacent latch circuits of the plurality of latch circuits; and
    a test control circuitry configured to perform (a) a test write operation by sequentially transferring bits of an input data pattern in a forward direction of the open conduction loop to cause the plurality of latch circuits to store the bits of the input data pattern in the plurality of latch circuits, and (b) a test read operation by transferring bits stored in the plurality of latch circuits in a backward direction of the open conduction loop to read out an output data pattern.

2. The semiconductor device of claim 1, wherein the test control circuitry is configured to compare the input data pattern and the output data pattern, and to determine presence or absence of a defect detection conduction path including a defect among the plurality of defect detection conduction paths.

3. The semiconductor device of claim 1, wherein the test control circuitry includes:
    a pattern generating circuitry configured to output each bit of the input data pattern per shifting period, the shifting period corresponding to a bit transfer period between the two adjacent latch circuits.

4. The semiconductor device of claim 1, wherein each of the plurality of defect detection conduction paths includes:
    a horizontal line in a conduction layer of the semiconductor die;
    a front vertical line connecting the horizontal line to a front latch circuit of the two adjacent latch circuits; and
    a back vertical line connecting the horizontal line to a back latch circuit of the two adjacent latch circuits.

5. The semiconductor device of claim 1, wherein each latch circuit of the plurality of latch circuits includes:
    a forward transfer gate connected to a front node;
    a first inverter having an input node and an output node, the input node of the first inverter connected to the forward transfer gate and the output node of the first inverter connected to a first intermediate node;
    a second inverter having an input node and an output node, the input node of the second inverter connected to the first intermediate node and the output node of the second inverter connected to a back node;
    a third inverter having an input node and an output node, the input node of the third inverter connected to the back node and the output node of the third inverter connected to the first intermediate node;
    a backward transfer gate connected to the front node;
    a fourth inverter having an input node and an output node, the input node of the fourth inverter connected to a second intermediate node and the output node of the fourth inverter connected to the back node;
    a fifth inverter having an input node and an output node, the input node of the fifth inverter connected to the back node and the output node of the fifth inverter connected to the second intermediate node; and
    a sixth inverter having an input node and an output node, the input node of the sixth inverter connected to the second intermediate node and the output node of the sixth inverter connected to the backward transfer gate.

6. The semiconductor device of claim 5, wherein the test control circuitry is configured to generate (a) a first forward clock signal to be applied to the forward transfer gate of odd-numbered latch circuits of the plurality of latch circuits, (b) a second forward clock signal to be applied to the forward transfer gate of even-numbered latch circuits of the plurality of latch circuits, (c) a first backward clock signal to be applied to the backward transfer gate of the odd-numbered latch circuits, and (d) a second backward clock signal to be applied to the backward transfer gate of the even-numbered latch circuits,
    the test control circuitry is configured to activate the first forward clock signal and the second forward clock signal to have opposite phases and to deactivate the first backward clock signal and the second backward clock signal during the test write operation, and
    the test control circuitry is configured to activate the first backward clock signal and the second backward clock signal to have opposite phases and to deactivate the first forward clock signal and the second forward clock signal during the test read operation.

7. The semiconductor device of claim 6, wherein the first through sixth inverters include tri-state inverters, each tri-state inverter of the tri-state inverters is configured to be enabled based on one of the first forward clock signal, the second forward clock signal, the first backward clock signal, and the second backward clock signal.

8. The semiconductor device of claim 1, wherein each latch circuit of the plurality of latch circuits includes:

a first transfer gate connected between a front node and a first intermediate node;

a first tri-state inverter having an input node and an output node, the input node of the first tri-state inverter connected to the first intermediate node and the output node of the first tri-state inverter connected to a second intermediate node;

a second tri-state inverter having an input node and an output node, the input node of the second tri-state inverter connected to the second intermediate node and the output node of the second tri-state inverter connected to the first intermediate node;

a second transfer gate connected between the second intermediate node and a third intermediate node;

a third tri-state inverter having an input node and an output node, the input node of the third tri-state inverter connected to the third intermediate node and the output node of the third tri-state inverter connected to a back node; and a fourth tri-state inverter having an input node and an output node, the input node of the fourth tri-state inverter connected to the back node and the output node of the fourth tri-state inverter connected to the third intermediate node.

9. The semiconductor device of claim 8, wherein the test control circuitry is configured to generate (a) a transfer clock signal to be applied to the first transfer gate and the second transfer gate of the plurality of latch circuits and (b) a direction clock signal to be applied to the first through fourth tri-state inverters of the plurality of latch circuits, the test control circuitry is configured to activate the transfer clock signal and the direction clock signal to have the same phases during the test write operation, and the test control circuitry is configured to activate the transfer clock signal and the direction clock signal to have opposite phases during the test read operation.

10. The semiconductor device of claim 1, further comprising:

path selector circuitries, each path selector circuitry of the path selector circuitries configured to form a first open conduction loop including reference latch circuits and the plurality of defect detection conduction paths, the first open conduction loop formed by electrically disconnecting each selection latch circuit of selection latch circuits from two adjacent defect detection conduction paths and directly electrically connecting the two adjacent defect detection conduction paths to one another, and each path selector circuitry of the path selector circuitries is configured to form a second open conduction loop including at least one of the selection latch circuits, the reference latch circuits, and the plurality of defect detection conduction paths, the second open conduction loop formed by electrically connecting the at least one of the selection latch circuits to two defect detection conduction paths, the plurality of defect detection conduction paths being grouped into the selection latch circuits and the reference latch circuits.

11. The semiconductor device of claim 1, wherein the plurality of defect detection conduction paths include:

a plurality of higher defect detection conduction paths, each higher defect detection conduction path of the plurality of higher defect detection conduction paths including a horizontal line in a higher conduction layer; and a plurality of lower defect detection conduction paths, each lower defect detection conduction path including a horizontal line in a lower conduction layer, the lower conduction layer below the higher conduction layer.

12. The semiconductor device of claim 11, further comprising:

path selector circuitries, each path selector circuitry of the path selector circuitries configured to form (a) a higher open conduction loop including the plurality of latch circuits and the plurality of higher defect detection conduction paths by electrically connecting each latch circuit of the plurality of latch circuits to two adjacent higher defect detection conduction paths, and (b) a lower open conduction loop including the plurality of latch circuits and the plurality of lower defect detection conduction paths by electrically connecting each latch circuit of the plurality of latch circuits to two adjacent lower defect detection conduction paths.

13. A method of detecting defects in a semiconductor device, the method comprising:

forming an open conduction loop in a peripheral region of a semiconductor die around a perimeter of the semiconductor die, the peripheral region surrounding a central region of the semiconductor die, the forming the open conduction loop by using a defect detection circuit arranged in the peripheral region, the defect detection circuit including a plurality of latch circuits and a plurality of defect detection conduction paths and configured to detect a penetration of a crack occurring during a sawing process of the semiconductor die, each defect detection conduction path of the plurality of defect detection conduction paths connecting two adjacent latch circuits of the plurality of latch circuits;

performing a test write operation by sequentially transferring bits of an input data pattern in a forward direction of the open conduction loop and storing the bits of the input data pattern in the plurality of latch circuits;

performing a test read operation by transferring bits stored in the plurality of latch circuits in a backward direction of the open conduction loop and reading out an output data pattern; and determining a defect detection conduction path including the presence of or absence of a defect among the plurality of defect detection conduction paths by comparing the input data pattern and the output data pattern.

14. The method of claim 13, wherein forming an open conduction loop includes:

forming a first open conduction loop including reference latch circuits and the plurality of defect detection conduction paths; and forming a second open conduction loop including at least one of selection latch circuits, the reference latch circuits, and the plurality of defect detection conduction paths, the plurality of defect detection conduction paths being grouped into the selection latch circuits and the reference latch circuits.

15. The method of claim 14, further comprising:

determining whether a defect is present, and determining a defect path range of the defect detection conduction paths including the defect by performing the test write operation and the test read operation with respect to the first open conduction loop; and in response to determining that the defect is present with respect to the first open conduction loop, determining a defect detection conduction path including the defect among the plurality of defect detection conduction paths by performing the test write operation and the test read operation with respect to the second open conduction loop.

16. The method of claim 15, wherein forming the second open conduction loop includes:
   including all of the selection latch circuits in the second open conduction loop independent of the defect path range.

17. The method of claim 15, wherein forming the second open conduction loop includes:
   including only the selection latch circuits corresponding to the defect path range in the second open conduction loop.

18. The method of claim 13, wherein the plurality of defect detection conduction paths include,
   a plurality of higher defect detection conduction paths, each higher defect detection conduction path including a horizontal line in a higher conduction layer, and
   a plurality of lower defect detection conduction paths, each lower defect detection conduction path including a horizontal line disposed in a lower conduction layer lower than the higher conduction layer, and
   wherein forming an open conduction loop includes,
   forming a higher open conduction loop including the plurality of latch circuits and the plurality of higher defect detection conduction paths, and
   forming a lower open conduction loop including the plurality of latch circuits and the plurality of lower defect detection conduction paths.

19. The method of claim 18, further comprising:
   determining whether a higher defect is present, and determining a higher defect path range of the higher defect detection conduction paths including the higher defect by performing the test write operation and the test read operation with respect to the higher open conduction loop; and
   determining whether a lower defect is present, and determining a lower defect path range of the lower defect detection conduction paths including the lower defect by performing the test write operation and the test read operation with respect to the lower open conduction loop.

20. A defect detection circuit comprising:
   a plurality of latch circuits; and
   a plurality of defect detection conduction paths, each defect detection conduction path of the plurality of defect detection conduction paths connecting two adjacent latch circuits of the plurality of latch circuits,
   wherein the defect detection circuit is in a peripheral region of a semiconductor die surrounding a central region of the semiconductor die and is arranged in an open conduction loop, and
   each latch circuit of the plurality of latch circuits is configured to transfer a bit stored in each latch circuit per shifting period to an adjacent latch circuit, the transferring in a forward direction of the open conduction loop or a backward direction of the open conduction loop.

* * * * *